US012772744B2

(12) United States Patent
Higo et al.

(10) Patent No.: US 12,772,744 B2
(45) Date of Patent: Oct. 20, 2026

(54) MAGNETORESISTIVE ELEMENT AND MAGNETIC MEMORY

(71) Applicant: SONY SEMICONDUCTOR SOLUTIONS CORPORATION, Kanagawa (JP)

(72) Inventors: Yutaka Higo, Kanagawa (JP); Lui Sakai, Kanagawa (JP); Masaki Endo, Kanagawa (JP); Keizo Hiraga, Kanagawa (JP); Masanori Hosomi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/729,141

(22) PCT Filed: Dec. 27, 2022

(86) PCT No.: PCT/JP2022/048226

§ 371 (c)(1),
(2) Date: Jul. 15, 2024

(87) PCT Pub. No.: WO2023/145371

PCT Pub. Date: Aug. 3, 2023

(65) Prior Publication Data

US 2025/0120322 A1 Apr. 10, 2025

(30) Foreign Application Priority Data

Jan. 25, 2022 (JP) ................................ 2022-009216

(51) Int. Cl.
*G11C 11/16* (2006.01)
*H01F 10/32* (2006.01)
(Continued)

(52) U.S. Cl.
CPC .......... *H10N 50/10* (2023.02); *G11C 11/161* (2013.01); *G11C 11/1673* (2013.01);
(Continued)

(58) Field of Classification Search
CPC ..................................................... H01N 50/10
(Continued)

(56) References Cited

U.S. PATENT DOCUMENTS 10,840,434 B2 * 11/2020 Kitagawa ............ H01F 10/3204
12,243,572 B2 * 3/2025 Yoshikawa ............ H10B 61/22
(Continued)

FOREIGN PATENT DOCUMENTS

JP 2018-014376 * 1/2018
JP 2018-014376 A 1/2018
(Continued)

OTHER PUBLICATIONS

International Search Report and Written Opinion of PCT Application No. PCT/JP2022/048226, issued on Mar. 14, 2023, 09 pages of ISRWO.

*Primary Examiner* — Muna A Techane
(74) *Attorney, Agent, or Firm* — CHIP LAW GROUP

(57) ABSTRACT

Provided is a magnetoresistive element with a second magnetic layer. The second magnetic layer is a perpendicular magnetization layer when no voltage is applied to the magnetoresistive element, changes from the perpendicular magnetization layer to an in-plane magnetization layer when a first voltage is applied to the magnetoresistive element, and changes from the perpendicular magnetization layer to the in-plane magnetization layer when a second voltage is applied to the magnetoresistive element. Magnetization of the second magnetic layer changes to a first direction of a direction perpendicular to a plane of the layer after a third voltage is applied to the magnetoresistive element for a first (Continued)

period of time and changes to a second direction of the direction perpendicular to the plane of the layer after a fourth voltage is applied to the magnetoresistive element for a second period of time.

8 Claims, 13 Drawing Sheets

(51) Int. Cl.
*H10N 50/10* (2023.01)
*H10N 50/80* (2023.01)

(52) U.S. Cl.
CPC ...... *G11C 11/1675* (2013.01); *H01F 10/3286* (2013.01); *H10N 50/80* (2023.02)

(58) Field of Classification Search
USPC .......................................................... 365/158
See application file for complete search history.

(56) References Cited

U.S. PATENT DOCUMENTS

| | | | |
|---|---|---|---|
| 2020/0357985 | A1 | 11/2020 | Sukegawa |
| 2021/0328136 | A1 | 10/2021 | Sasaki |

FOREIGN PATENT DOCUMENTS

| | | | | |
|---|---|---|---|---|
| JP | 2018-055752 | | * | 4/2018 |
| JP | 2018-055752 | A | | 4/2018 |
| JP | 2020-181869 | | * | 11/2020 |
| JP | 2020-181869 | A | | 11/2020 |

* cited by examiner

FIG. 10A VCMA EFFICIENCY $\beta$ =0fJ/Vm
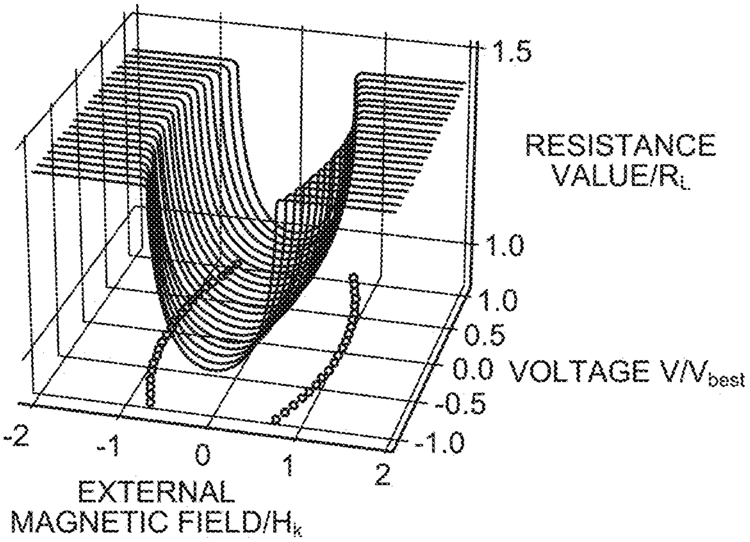
FIG. 10B VCMA EFFICIENCY $\beta$ =300fJ/Vm
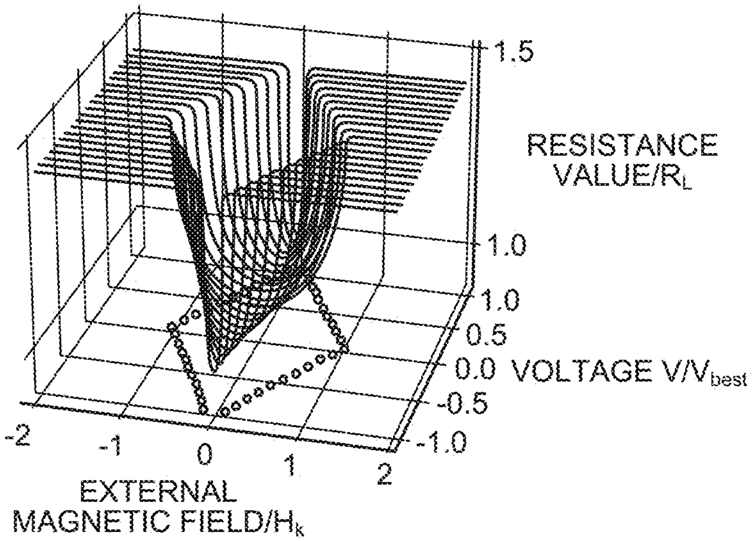

MAGNETORESISTIVE ELEMENT AND MAGNETIC MEMORY

CROSS REFERENCE TO RELATED APPLICATIONS

This application is a U.S. National Phase of International Patent Application No. PCT/JP2022/048226 filed on Dec. 27, 2022, which claims priority benefit of Japanese Patent Application No. JP 2022-009216 filed in the Japan Patent Office on Jan. 25, 2022. Each of the above-referenced applications is hereby incorporated herein by reference in its entirety.

FIELD

The present disclosure relates to a magnetoresistive element and a magnetic memory.

BACKGROUND

For example, Patent Literature 1 discloses a bipolar voltage writing type magnetic memory element having a planar shape without mirror symmetry or rotational symmetry.

CITATION LIST

Patent Literature

Patent Literature 1: JP 2018-14376 A

SUMMARY

Technical Problem

The magnetic memory element as disclosed in Patent Literature 1 is difficult to manufacture due to reasons such as a large variation in the shape.

One aspect of the present disclosure provides a magnetoresistive element and a magnetic memory that enable bipolar voltage writing and are easy to manufacture.

Solution to Problem

A magnetoresistive element according to one aspect of the present disclosure includes: a first magnetic layer; a second magnetic layer that changes between a perpendicular magnetization layer in which perpendicular magnetic anisotropy energy is positive, and an in-plane magnetization layer in which the perpendicular magnetic anisotropy energy is negative, the perpendicular magnetic anisotropy energy determined on a basis of a difference between magnetic energy when magnetized in a plane direction of the layer and magnetic energy when magnetized in a direction perpendicular to the plane direction of the layer; and a nonmagnetic layer disposed between the first magnetic layer and the second magnetic layer, wherein the second magnetic layer: is the perpendicular magnetization layer when no voltage is applied to the magnetoresistive element; changes from the perpendicular magnetization layer to the in-plane magnetization layer when a first voltage is applied to the magnetoresistive element; and changes from the perpendicular magnetization layer to the in-plane magnetization layer when a second voltage is applied to the magnetoresistive element, magnetization of the second magnetic layer: changes to a first direction of a direction perpendicular to a plane of the layer after a third voltage is applied to the magnetoresistive element for a first period of time; and changes to a second direction of the direction perpendicular to the plane of the layer after a fourth voltage is applied to the magnetoresistive element for a second period of time, the first voltage and the second voltage are in opposite directions to each other, and the third voltage and the fourth voltage are in opposite directions to each other.

A magnetic memory according to one aspect of the present disclosure includes: a plurality of magnetoresistive elements, wherein each of the plurality of magnetoresistive elements includes: a first magnetic layer; a second magnetic layer that changes between a perpendicular magnetization layer in which perpendicular magnetic anisotropy energy is positive, and an in-plane magnetization layer in which the perpendicular magnetic anisotropy energy is negative, the perpendicular magnetic anisotropy energy obtained by subtracting magnetic energy when magnetized in a stacking direction from magnetic energy when magnetized in a plane direction of the layer; and a nonmagnetic layer disposed between the first magnetic layer and the second magnetic layer, the second magnetic layer: is the perpendicular magnetization layer when no voltage is applied to the magnetoresistive element; changes from the perpendicular magnetization layer to the in-plane magnetization layer when a first voltage is applied to the magnetoresistive element; and changes from the perpendicular magnetization layer to the in-plane magnetization layer when a second voltage is applied to the magnetoresistive element, magnetization of the second magnetic layer: changes to a first direction on a plane of the layer while a third voltage is applied to the magnetoresistive element; and changes to a second direction on the plane of the layer while a fourth voltage is applied to the magnetoresistive element, the first voltage and the second voltage are in opposite directions to each other, and the third voltage and the fourth voltage are in opposite directions to each other.

BRIEF DESCRIPTION OF DRAWINGS

FIGS. 10A and 10B include diagrams three-dimensionally illustrating the resistance value of the magnetoresistive element for various combinations of applied voltages and external magnetic fields.

DESCRIPTION OF EMBODIMENTS

Figure 1:
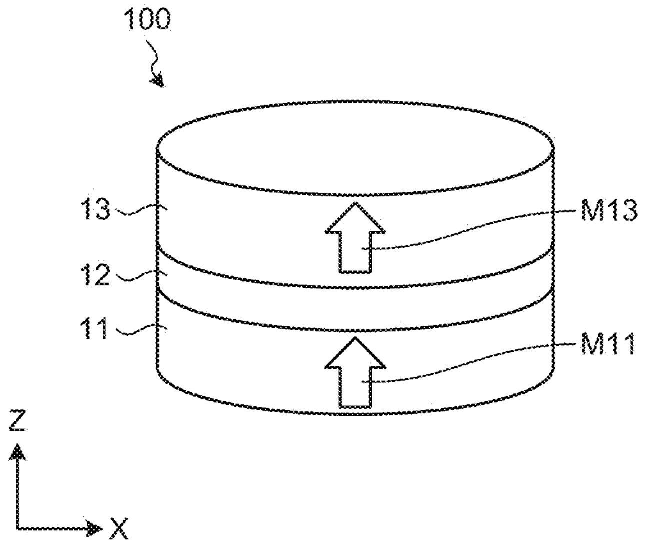
FIG. 1 is a diagram illustrating an example of a schematic structure of a magnetoresistive element according to an embodiment.

Hereinafter, embodiments of the present disclosure will be described in detail on the basis of the drawings. Note that in each of the following embodiments, the same parts are denoted by the same symbols, and redundant description will be omitted. In addition, the disclosed technology is not limited to the embodiments, and various numerical values and materials in the embodiments are examples.

The present disclosure will be described in the following order of items.

0. Introduction
1. First Embodiment
2. Second Embodiment
3. Exemplary Effects

0. Introduction

Magnetic memories (for example, magnetoresistive random access memories (MRAMs)) using a magnetoresistive element as a storage element holds information by a magnetization state of a ferromagnetic body and thus has nonvolatility in which recorded data is held even when the power is turned off. The basic structure of a magnetoresistive element is a sandwich structure in which a nonmagnetic layer (an insulator thin film or the like) is sandwiched between two magnetic layers (magnetic thin films or the like). Since the thickness (for example, film thickness) of the nonmagnetic layer is as very thin as about several nanometers, when a voltage is applied to both ends of the magnetoresistive element, a tunnel current flows. The magnitude of the tunnel current is dependent on a relative angle of magnetization of the two magnetic layers. This is called a tunnel magneto resistance (TMR) effect.

In an MRAM, magnetization of one magnetic layer (pinned layer) of two magnetic layers is fixed, whereas magnetization of the other magnetic layer (recording layer) is controlled by an external field. A state in which the magnetization of the pinned layer and the magnetization of the recording layer are parallel to each other is defined as state 0, and a state of being antiparallel to each other is defined as state 1. In this manner, by rewriting the parallel/antiparallel state of magnetization, information ("0" or "1") is stored in a nonvolatile manner. Those conceivable as the external field to be used for controlling the magnetization direction include a current magnetic field generated by conduction of a current to an external wire, a method of directly conducting a current to a magnetoresistive element to utilize a spin transfer torque (STT) effect, a method of utilizing voltage controlled magnetic anisotropy (VCMA), and others. The TMR effect is used for reading out information.

Magnetic memories that are currently the mainstream are STT-MRAMs that can be miniaturized as compared with a case of using a current magnetic field and can also suppress power consumption. Meanwhile, voltage controlled (VC) MRAMs utilizing VCMA attracts attention since writing can be performed at a high speed and with lower power consumption. The conventional voltage writing method utilizing VCMA implements bidirectional writing by applying an ultra-high speed pulse voltage with a single polarity (applying a voltage only in one direction). Meanwhile, Patent Literature 1 reports on a bipolar voltage writing method in which writing is performed by inducing bidirectional magnetization reversal by applying a bipolar voltage.

In the conventional voltage writing method, a bidirectional writing operation is performed with a unipolar voltage but is not practical due to the following disadvantages.

When no voltage is applied to the magnetoresistive element, the magnetization direction of the recording layer is in the perpendicular direction (corresponding to a Z-axis direction described later) due to perpendicular magnetic anisotropy (the property that the magnetization tends to be in a direction perpendicular to a layer surface) of the recording layer. Similarly, the magnetization of the pinned layer is also in the perpendicular direction (Z-axis direction) due to the perpendicular magnetic anisotropy.

Let us presume that both the magnetization of the recording layer and the magnetization of the pinned layer are in the Z-axis positive direction, namely, in a parallel state, and information 0 is written. It is also based on the premise that an external magnetic field is applied in the X-axis positive direction among in-plane directions (X-axis and Y-axis directions). Here, when a pulse voltage is applied, the perpendicular magnetic anisotropy of the recording layer is reduced by an electric field generated in the vicinity of the interface between a nonmagnetic layer and the recording layer, and the property that the magnetization of the recording layer tends to be oriented in the Z-axis direction is lost. As a result, the magnetization of the recording layer starts to move in the X-axis direction in which the energy is stabilized by the external magnetic field.

The magnetization of the recording layer does not simply change linearly from the Z-axis positive direction to the X-axis positive direction but starts so-called precession in which the magnetization gradually moves in the X-axis positive direction while circling on a Y-Z plane. There is a moment at which the magnetization of the recording layer, which has been initially directed in the Z-axis positive direction, is directed substantially in the Z-axis negative direction during the circling motion on the Y-Z plane. At this point, when the pulse voltage is set to zero, the perpendicular magnetic anisotropy of the recording layer returns to the original state, and the magnetization of the recording layer tends to be directed in the Z-axis direction, and thus, the magnetization of the recording layer is fixed to the Z-axis negative direction. That is, the state in which the information 0 is written before the pulse voltage has been applied is changed to the state in which the information 1 is written in which the magnetization of the recording layer and the magnetization of the pinned layer are antiparallel to each other. The same applies to a case where the magnetization of the recording layer is initially directed in the Z-axis negative direction, and thus bidirectional writing can be implemented with a unipolar pulse voltage.

However, in the above-described writing method, the waveform of the pulse voltage needs to be controlled with high accuracy. In general, the cycle of the circling motion on the Y-Z plane is in the order of 1 ns, and if the time for applying the pulse voltage deviates from the ideal half cycle, writing in a desired state cannot be performed, and a writing error occurs. In a magnetic memory including a plurality of magnetoresistive elements, a cycle varies among magnetoresistive elements, which brings about a more serious disadvantage. In the conventional voltage writing method, it is difficult to reduce the write error rate to a practical level. In addition, an external magnetic field is required to cause precession; however, this is generally implemented by embedding a permanent magnet in a chip. However, an extra process is required, and it is not easy to generate a uniform magnetic field in the chip.

In order to solve this disadvantage, Patent Literature 1 proposes a magnetoresistive element and a writing method capable of implementing bidirectional writing using a bipolar voltage by utilizing the Dzyaloshinsky-Moriya interaction acting on a ferromagnetic layer. The junction cross-sectional shape (shape when viewed in the Z-axis direction) of the magnetoresistive element of Patent Literature 1 is characterized by having a shape without mirror symmetry nor rotational symmetry (for example, a scalene triangular shape) or (2) a shape having mirror symmetry only with respect to a specific one axis (for example, an isosceles triangular shape). As a result, a distribution of magnetization directions is generated by application of the pulse voltage, thereby implementing bidirectional writing. In addition, since the writing method does not use the precession, it is not necessary to control the pulse shape with high accuracy.

However, since the magnetoresistive element of Patent Literature 1 has neither mirror symmetry nor rotational symmetry in a junction cross-sectional shape, the variation in shape tends to be large or edges tend to be rounded in element forming processes such as element patterning or etching. This results in a disadvantage that the stability of the writing operation is deteriorated. There is also another disadvantage that an external magnetic field is required as in the conventional voltage writing method.

Such disadvantages are addressed by the disclosed technology. For example, a magnetoresistive element capable of performing writing at high speed and with low power consumption is provided. This further provides a magnetic memory that has achieved improved performance.

As a result of research using a macro-spin model, the inventors of the present application have invented a magnetoresistive element capable of implementing bidirectional writing using a bipolar voltage even in a state without an external magnetic field. Since no external magnetic field is required, there is no need to embed a permanent magnet in the chip. A junction cross-sectional shape of the magnetoresistive element has mirror symmetry or rotational symmetry such as a circle, an ellipse, a square, or a rectangle. VCMA works to reduce the perpendicular magnetic anisotropy of the recording layer regardless of whether a positive voltage or a negative voltage is applied. This can be implemented by adjusting a material, a stacked structure, an interface state, and the like of each layer included in the magnetoresistive element. In addition, by applying a voltage, STT acts on the magnetization of the recording layer by a current passing through the magnetoresistive element, and the direction of the magnetization is determined by the direction of the current.

In the bipolar voltage writing method of the conventional art, a cross-sectional shape with low symmetry is required, whereas in the disclosed technology, since the junction cross-sectional shape of the magnetoresistive element has high symmetry, the variation in shape in the forming step is small. As a result, variations in the speed and the stability of the writing operation can be suppressed. In addition, since no external magnetic field is required, an extra process of embedding a permanent magnet in a chip can be omitted, and the variation in writing operation caused by non-uniformity of external magnetic fields can be eliminated.

1. First Embodiment

FIG. 1 is a diagram illustrating an example of a schematic structure of a magnetoresistive element according to an embodiment. A magnetoresistive element 100 has a stacked structure. An X-axis direction (and a Y-axis direction) corresponds to a plane direction (extending direction) of a layer. A Z-axis direction corresponds to a direction perpendicular to the plane direction of the layer (stacking direction). Note that a layer may be a film, and a layer and a film may be read interchangeably as appropriately as long as there is no contradiction.

In the example illustrated in FIG. 1, the magnetoresistive element 100 includes a magnetic layer 11, a nonmagnetic layer 12, and a magnetic layer 13. The magnetic layer 11, the nonmagnetic layer 12, and the magnetic layer 13 are stacked in this order in the Z-axis positive direction. The nonmagnetic layer 12 is included between the magnetic layer 11 and the magnetic layer 13. Incidentally, a base layer, a cap layer, and others (not illustrated) may be further stacked in order to control the crystal structure or magnetic characteristics of the layers or to secure electrical connection. Each layer may have a single layer structure made of a single material or may have a stacked structure in which a plurality of layers is stacked.

Examples of the shape (for example, a junction cross-sectional shape) of the magnetoresistive element 100 when viewed in the Z-axis direction include a mirror-symmetrical shape, a rotation-symmetrical shape, and the like. More specific examples of the shape are a round shape, an elliptical shape, and even more specifically, the magnetoresistive element 100 has a round shape, an elliptical shape, a square shape, a rectangular shape, or the like when viewed in the Z-axis direction. In the present embodiment, a round shape is taken as an example.

The magnetization of the magnetic layer 11 is referred to as magnetization M11, the direction of which is schematically illustrated by an arrow. Similarly, the magnetization of the magnetic layer 13 is referred to as magnetization M13, the direction of which is also schematically illustrated by an arrow. The magnetic layer 11 is a first magnetic layer (pinned layer) in which the direction of the magnetization M11 is fixed. The magnetic layer 13 is a second magnetic layer (recording layer) in which the direction of the magnetization M13 changes. Information to be recorded in the magnetoresistive element 100 is determined by the direction of the magnetization M13 of the magnetic layer 13 with respect to the magnetization M11 of the magnetic layer 11. Note that the magnetic layer 11 may be the recording layer, and the magnetic layer 13 may be the pinned layer.

Figure 2A:
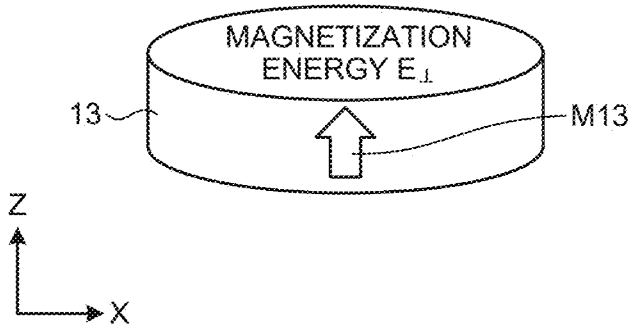
FIGS. 2A and 2B include diagrams illustrating examples of the magnetization direction of a second magnetic layer (recording layer).
Figure 2B:
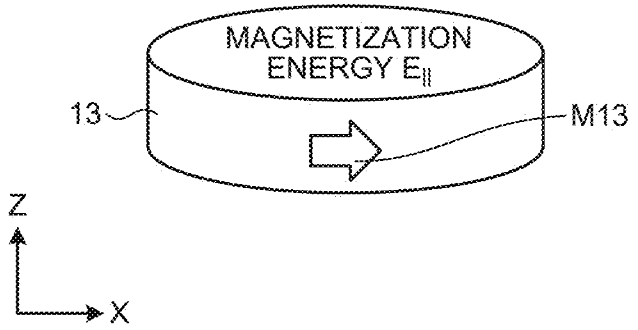

FIGS. 2A and 2B include diagrams illustrating examples of the magnetization direction of the second magnetic layer (recording layer). The magnetic layer 13 has magnetic energy E corresponding to the magnetization M13. In the example illustrated in FIG. 2A, the magnetization M13 of the magnetic layer 13 is oriented in the Z-axis direction. The magnetic energy of the magnetic layer 13 at this point is referred to as magnetic energy $E_{\perp}$. In the example illustrated in FIG. 2B, the magnetization M13 of the magnetic layer 13 is oriented in the X-axis direction. The magnetic energy of the magnetic layer 13 at this point is referred to as magnetic energy $E_{\parallel}$.

From the magnitude relationship between the magnetic energy $E_{\perp}$ and the magnetic energy $E_{\parallel}$, the direction (magnetization ease axis) in which the magnetization M13 tends to be oriented is determined. In the magnetic energy of the magnetic layer 13 when no voltage is applied to the magnetoresistive element 100, the magnetic energy $E_{\parallel}$ is larger than the magnetic energy $E_{\perp}$ ($E_{\parallel}>E_{\perp}$). The magnetization ease axis at this point is the Z-axis direction, and the magnetic layer 13 at this point is also referred to as a perpendicular magnetization layer. On the other hand, as will be described later, by applying a voltage to the magnetoresistive element 100, the magnetic layer 13 changes such that the magnetic energy $E_{\parallel}$ becomes smaller than the magnetic energy $E_{\perp}$ ($E_{\parallel}<E_{\perp}$). The magnetization ease axis at this point is an in-plane direction, and the magnetic layer 13 at this point is also referred to as an in-plane magnetization layer. That is, the magnetic layer 13 changes between the perpendicular magnetization layer and the in-plane magnetization layer.

More specifically, the magnetic layer 13 changes between the perpendicular magnetization layer and the in-plane magnetization layer depending on the polarity of the perpendicular magnetic anisotropy energy Ku. The perpendicular magnetic anisotropy energy Ku is given by the following Equation (1).

$$KuV = E_{\parallel} - E_{\perp} \tag{1}$$

In the above Equation (1), V represents the volume of the magnetic layer 13. In a case where the perpendicular magnetic anisotropy energy Ku is positive (Ku>0), the magnetic layer 13 is a perpendicular magnetization layer. In a case where the perpendicular magnetic anisotropy energy Ku is negative (Ku<0), the magnetic layer 13 is an in-plane magnetization layer.

VCMA is induced by a voltage applied to the magnetoresistive element 100, more specifically, a voltage applied between the magnetic layer 11 and the magnetic layer 13. The perpendicular magnetic anisotropy energy Ku of the magnetic layer 13 decreases regardless of the sign of the voltage. This will be described with reference to FIGS. 3 and 4.

Figure 3:
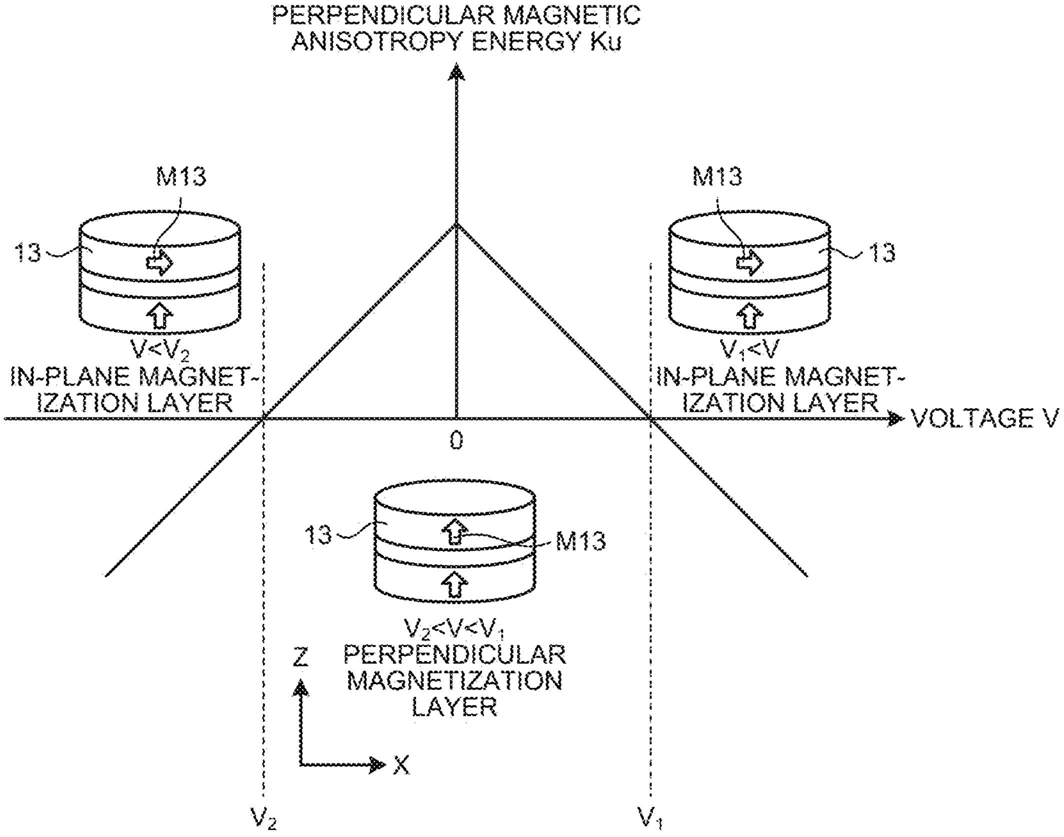
FIG. 3 is a diagram schematically illustrating a relationship between the voltage and the magnetic anisotropy energy.
Figure 4:
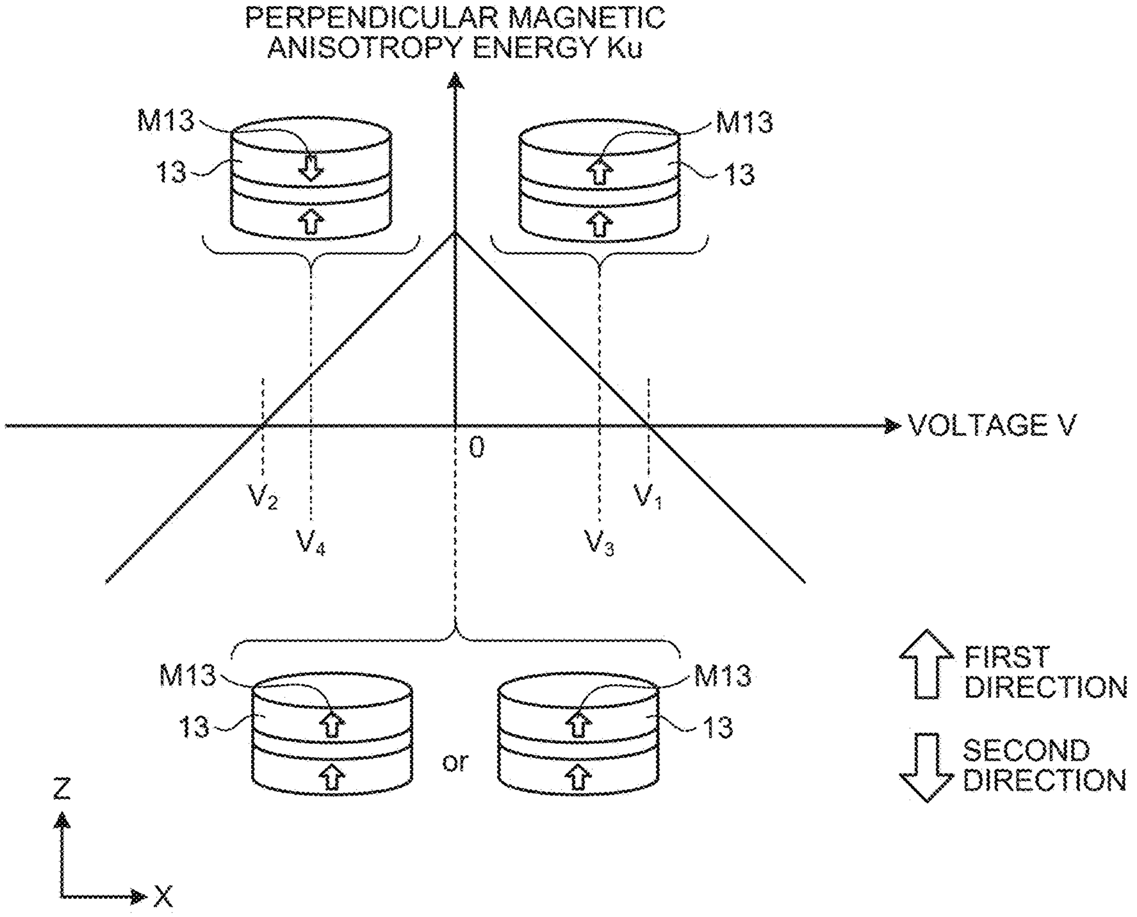
FIG. 4 is a diagram schematically illustrating a relationship between the voltage and the magnetic anisotropy energy.

FIGS. 3 and 4 are diagrams schematically illustrating a relationship between the voltage and the magnetic anisotropy energy. The horizontal axis of the graph represents the voltage V applied to the magnetoresistive element 100. The vertical axis of the graph represents the perpendicular magnetic anisotropy energy Ku of the magnetic layer 13. The perpendicular magnetic anisotropy energy Ku changes in a substantially A (lambda) shape with respect to the voltage V. That is, when the voltage V is zero (when the voltage V is not applied), the perpendicular magnetic anisotropy energy Ku is the largest. The perpendicular magnetic anisotropy energy Ku is positive, and the magnetic layer 13 is a perpendicular magnetization layer. As the absolute value of the voltage V increases (as it goes away from zero), the perpendicular magnetic anisotropy energy Ku decreases linearly. When the perpendicular magnetic anisotropy energy Ku changes from positive to negative, the magnetic layer 13 changes from the perpendicular magnetization layer to an in-plane magnetization layer.

In FIG. 3, illustrated is the dependence of the perpendicular magnetic anisotropy energy Ku on the voltage V in a case where VCMA is considered but STT is not considered. The voltage V when the perpendicular magnetic anisotropy energy Ku changes from positive to negative (Ku=0) is referred to as a voltage $V_1$ and a voltage $V_2$ in the drawing. The voltage $V_1$ and the voltage $V_2$ are a first voltage and a second voltage, respectively, in opposite directions (having different signs). In this example, the voltage $V_1$ is greater than zero ($0<V_1$) and the voltage $V_2$ is less than zero ($V_2<0$). The absolute value of the voltage $V_1$ and the absolute value of the voltage $V_2$ may be the same.

When the voltage V is larger than the voltage $V_2$ and smaller than the voltage $V_1$ ($V_2<V<V_1$), the magnetic layer 13 is a perpendicular magnetization layer. On the other hand, when the voltage V is less than or equal to $V_2$ or more than or equal to $V_1$ ($V\leq V_2$ or $V_1\leq V$), the magnetic layer 13 is an in-plane magnetization layer. That is, when the voltage $V_1$ or the voltage $V_2$ is applied to the magnetoresistive element 100, the magnetic layer 13 changes from the perpendicular magnetization layer to the in-plane magnetization layer. More specifically, the perpendicular magnetic anisotropy energy Ku decreases as the voltage V approaches the voltage $V_1$ from zero and changes from positive to negative at the voltage $V_1$. Likewise, the perpendicular magnetic anisotropy energy Ku linearly decreases as the voltage V approaches the voltage $V_2$ from zero and changes from positive to negative at the voltage $V_2$.

Note that there are cases where the nonmagnetic layer 12 is electrostatically destroyed by the application of the voltage V, and the voltage $V_1$ or the voltage $V_2$ cannot be substantially applied. In that case, the voltage dependence of the perpendicular magnetic anisotropy energy Ku on a lower voltage side with respect to the voltage $V_1$ or the voltage $V_2$ is extrapolated to a higher voltage side, and the voltage V when the perpendicular magnetic anisotropy energy Ku changes from positive to negative can be regarded as the voltage $V_1$ and the voltage $V_2$.

In order to actually write information in the magnetoresistive element 100, STT is used. The current passing through the magnetoresistive element 100 causes the STT to act on the magnetization M13 of the magnetic layer 13.

In FIG. 4, illustrated is the dependence of the perpendicular magnetic anisotropy energy Ku on the voltage V in a case where both VCMA and STT are considered. Examples of the voltage V applied in this case include a voltage $V_3$ and a voltage $V_4$. The voltage $V_3$ and the voltage $V_4$ are a third voltage and a fourth voltage, respectively, in opposite directions to each other. In this example, the voltage $V_3$ is greater than zero ($0<V_3$), and the voltage $V_4$ is less than zero ($V_4<0$). That is, the voltage $V_1$ and the voltage $V_3$ are voltages in the same direction (same sign). The voltage $V_2$ and the voltage $V_4$ are voltages in the same direction. The absolute value of the voltage $V_3$ and the absolute value of the voltage $V_4$ may be the same.

When the voltage $V_3$ is applied to the magnetoresistive element 100, the perpendicular magnetic anisotropy energy Ku is reduced by VCMA, and at the same time, magnetization reversal occurs by STT. After the voltage $V_3$ is applied to the magnetoresistive element 100 for a first period of time, the direction of the magnetization M13 of the magnetic layer 13 changes to a first direction in the Z-axis direction. The first period of time is a time required for magnetization reversal and may be, for example, less than or equal to 100 ns as described later. In this example, the first direction is the Z-axis positive direction.

When the voltage $V_4$ is applied to the magnetoresistive element 100, the perpendicular magnetic anisotropy energy Ku is reduced by VCMA, and at the same time, magnetization reversal occurs by STT that is in a direction opposite to that at the time of applying the voltage $V_3$ described above. After the voltage $V_4$ is applied to the magnetoresistive element 100 for a second period of time, the direction of the magnetization M13 of the magnetic layer 13 changes to a second direction in the Z-axis direction. The second period of time is a time required for magnetization reversal and may be, for example, less than or equal to 100 ns similarly to the first period of time. In this example, the second direction is the Z-axis negative direction.

As described above, bidirectional writing can be implemented with a bipolar voltage by using not only VCMA but also STT. In addition, since the perpendicular magnetic anisotropy energy Ku is reduced by VCMA, the power required for writing information can be reduced as compared with a case where there is no VCMA.

The above method was theoretically analyzed by a macro-spin model. As a result of diligent research on a macro-spin model in a case where VCMA and STT act simultaneously, it has become clear that an equivalent circuit of the following Equation (2) can explain.

$$G = 1/R + I_{c0}/V_{c0} \qquad (2)$$

In the above Equation (2), G denotes conductance when a resistance R and a characteristic resistance $Ic_0/Vc_0$ of the magnetoresistive element 100 are connected in parallel. $Ic_0$ denotes a critical reversal current due to STT when there is no VCMA. $Vc_0$ denotes a voltage V at which the perpendicular magnetic anisotropy energy Ku changes from positive to negative (Ku=0) by VCMA and corresponds to the absolute value of the voltage $V_1$ and the absolute value of the voltage $V_2$ described above.

Next, Ohm's law expressed by the following Equation (3) holds.

$$GV = I_{c0} + Qt \qquad (3)$$

In the above Equation (3), t denotes a pulse width. Q denotes an amount that determines the pulse width dependence of the reversal current and is measured in units of charge. From the above Equations (2) and (3), the voltage $V_{best}$ at which the power consumption is the lowest is obtained as in the following Equation (4).

$$V_{best} = 2I_{c0}/G \qquad (4)$$

Meanwhile, since the conductance G satisfies $G>Ic_0/Vc_0$, $V_{best}<2Vc_0$ is obtained. This will be described with reference to FIG. 5.

Figure 5:
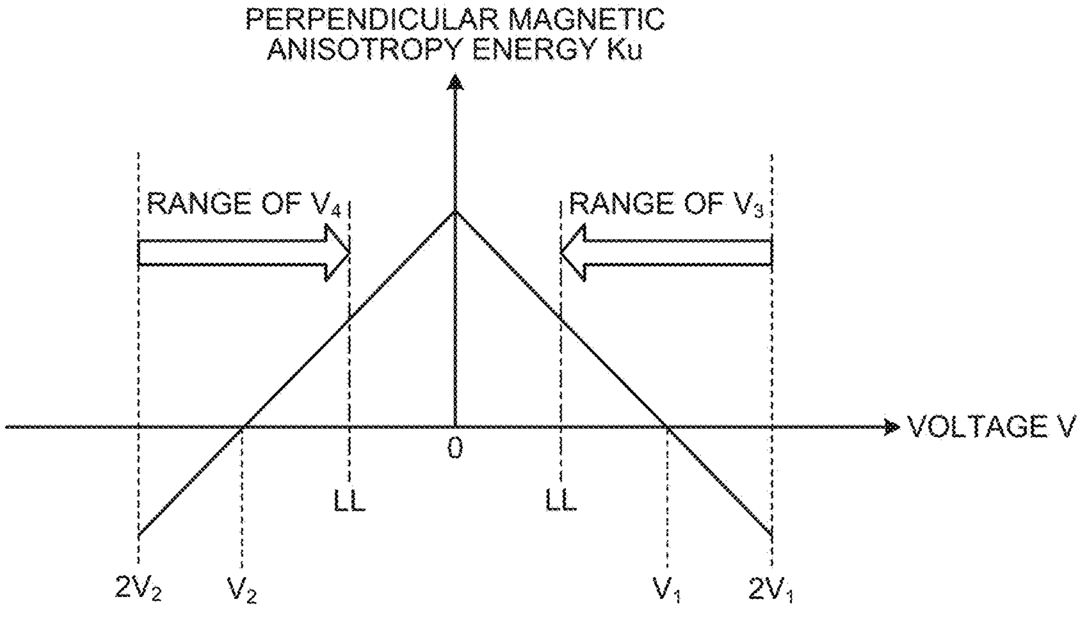
FIG. 5 is a diagram illustrating an example of voltage ranges.

FIG. 5 is a diagram illustrating an example of voltage ranges. The upper limit value of the absolute value of the voltage $V_3$ described above is twice the absolute value of the voltage $V_1$. The upper limit value of the absolute value of the voltage $V_4$ is twice the absolute value of the voltage $V_2$. That is, as in the following Inequations (5), the absolute value of the voltage $V_3$ is less than or equal to twice the absolute value of the voltage $V_1$. The absolute value of the voltage $V_4$ is less than or equal to twice the absolute value of the voltage $V_2$.

$$|V_3| \leqq 2 \times |V_1| \qquad (5)$$

$$|V_4| \leqq 2 \times |V_2|$$

The lower limit value LL of the absolute values of the voltage $V_3$ and the voltage $V_4$ depends on the operation condition but may be, for example, such a voltage value that the reversal time does not exceed 100 ns as described later.

FIGS. 6A, 6B, 6C, and 7 are diagrams illustrating an example of simulation based on a macro-spin model. Simulation conditions are as follows. Incidentally, it is based on the premise that the magnetoresistive element 100 has a round shape when viewed in the Z-axis direction.

Saturation magnetization Ms=1 MA/m

Diameter W of the magnetoresistive element=50 nm

Thickness tfree of the magnetic layer 13=1 nm

Thermal stability index Δ=100

Error rate=10–7

Spin polarization rate η=0.7

VCMA efficiency β=300 fJ/Vm

Figure 6B:
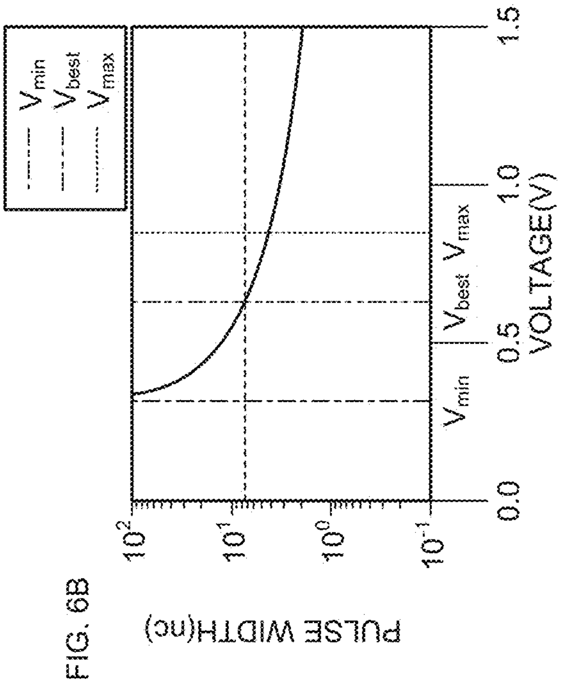
FIGS. 6A, 6B, and 6C include graphs illustrating an example of simulation by a macro-spin model.
Figure 6C:
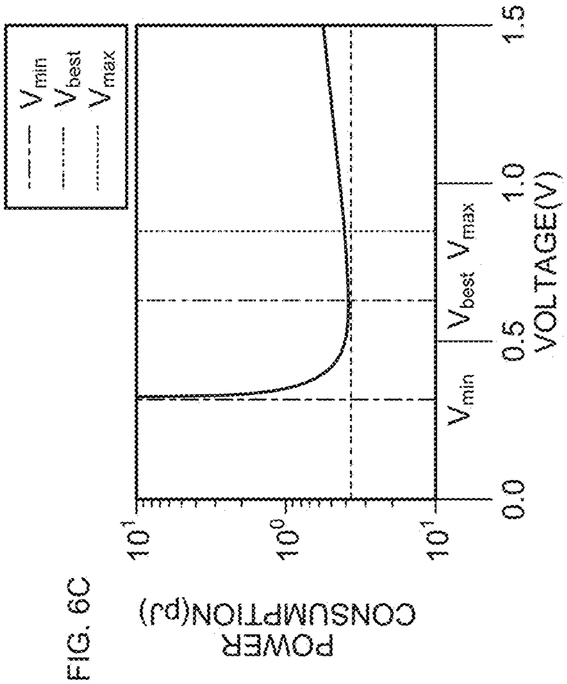
Figure 6A:
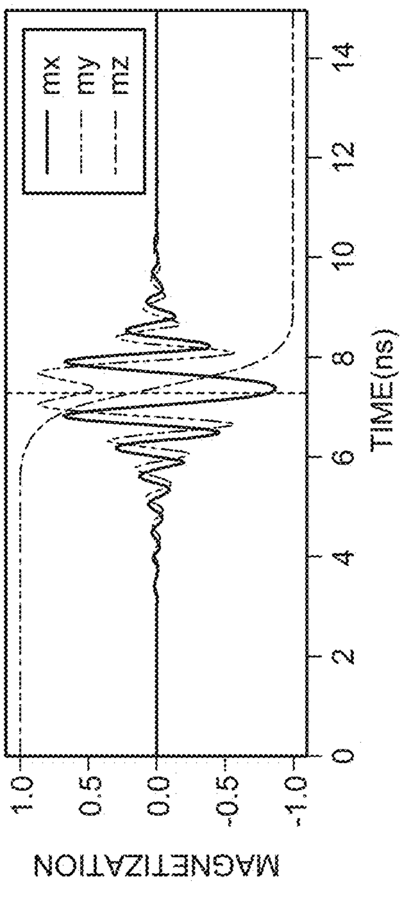

In FIG. 6A, illustrated is a magnetization motion in a case where an area resistance RA is 10 Ωμm2, a damping constant α is 0.02, and the voltage V is 0.6 V. The horizontal axis of the graph indicates time (ns). The vertical axis of the graph indicates the magnitude of the magnetization M13. A graph line mx indicates the magnitude of the magnetization M13 in the X-axis direction (x component). A graph line my indicates the magnitude of the magnetization M13 in the Y-axis direction (y component). A graph line mz indicates the magnitude of the magnetization M13 in the Z-axis direction (z component). Near time=7.5 ns (i.e., voltage application time=about 7.5 ns), the z component of the magnetization M13 drops to zero, at which point the writing completes. However, the voltage application time can be made longer in order to secure a margin.

In FIG. 6B, illustrated is the voltage dependence of the writing pulse width (ns). In FIG. 6C, illustrated is the voltage dependence of the power consumption (pJ). Writing is possible at a voltage higher than or equal to a voltage Vmin, and the power consumption is minimized at the voltage Vbest. A voltage Vmax is the maximum applicable voltage for preventing the magnetoresistive element 100 from electrostatic breakdown. Since low power consumption is desirable, it is desirable to perform writing at the voltage Vbest; however, it is desirable to perform writing at a low voltage in order to reduce the probability of electrostatic breakdown. Ultimately, the writing voltage V is desirably set to be lower than or equal to the voltage Vbest. From a theoretical formula, it is known that this condition is less than or equal to 2Vc0. The minimum value of the writing voltage V is desirably larger than the voltage at which the reversal time is 100 ns since the power consumption rapidly increases when the reversal time is longer than 100 ns, for example.

Figure 7:
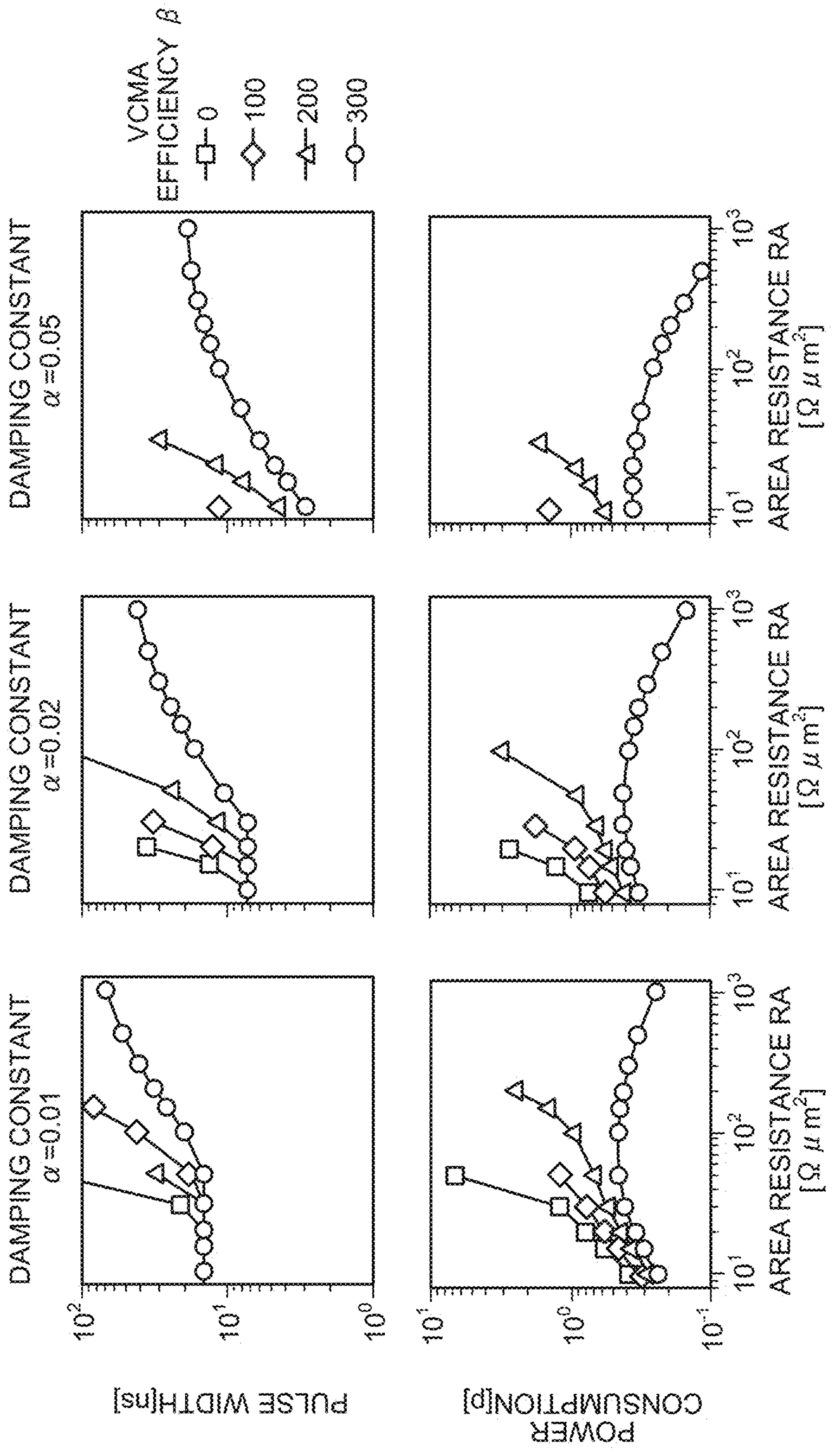
FIG. 7 includes graphs illustrating an example of simulation by the macro-spin model.

In FIG. 7, illustrated are plots of combinations in which the power consumption is minimized under various conditions. Incidentally, a plot is interrupted in the middle since it is not possible to write due to the electrostatic breakdown. The VCMA efficiency β is an amount proportional to the dependency of the perpendicular magnetic anisotropy energy Ku on the voltage V, and its unit is fJ/Vm. As the VCMA efficiency β increases, the area resistance RA increases, and writing becomes possible even with a high damping constant α. Since the magnetoresistive element using VCMA tends to have high RA and high α, it can be said that the writing method of the embodiment has high affinity.

As described above, in the magnetoresistive element 100 of the embodiment, writing is performed using both VCMA and STT. Characteristics of the external magnetic field dependency of the resistance value of the magnetoresistive element 100 appearing in such a case will be described.

Figure 8:
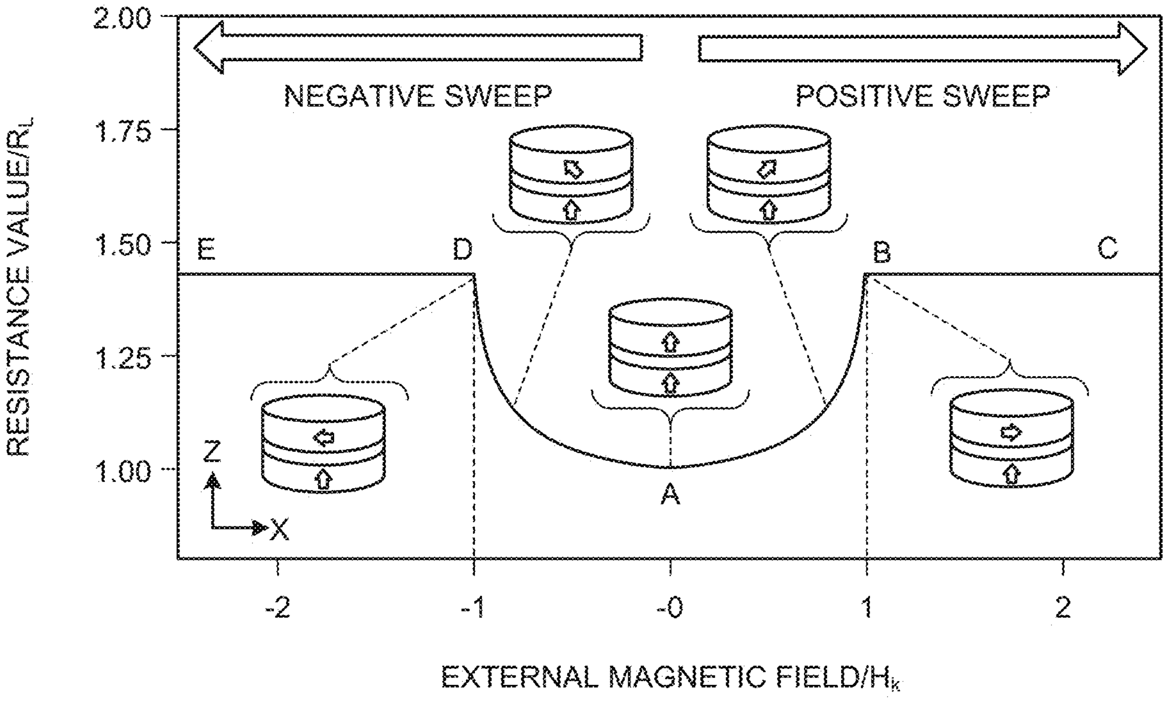
FIG. 8 is a graph illustrating an example of a change in the resistance value when an external magnetic field is applied to layers.
Figure 9A:
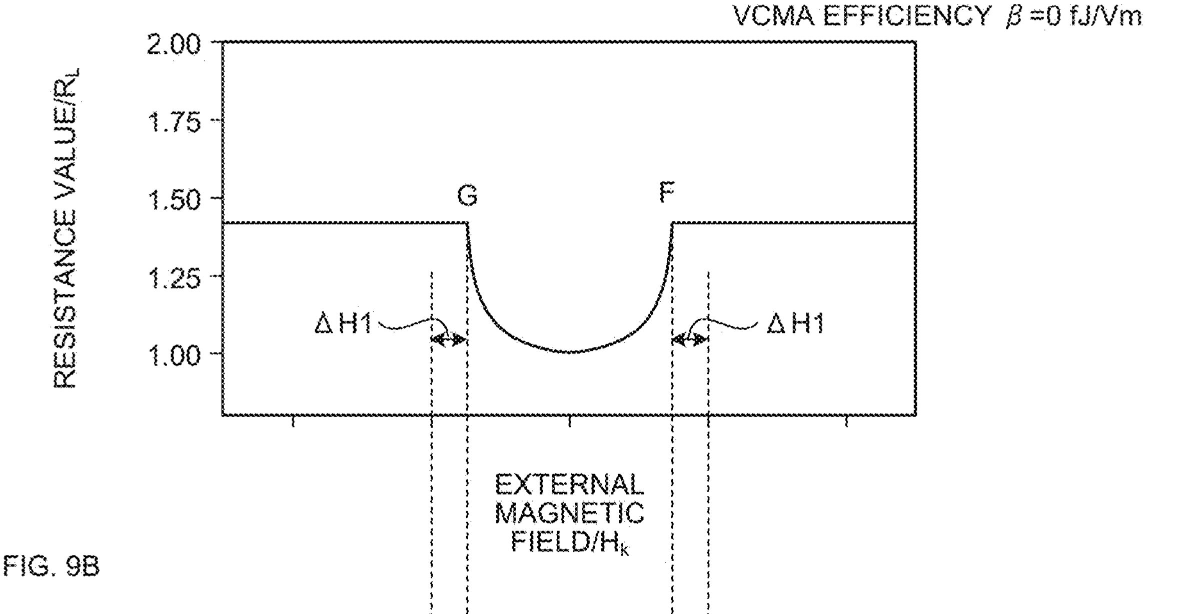
FIGS. 9A and 9B include graphs illustrating an example of a change in the resistance value when an external magnetic field is applied to the layers.
Figure 9B:
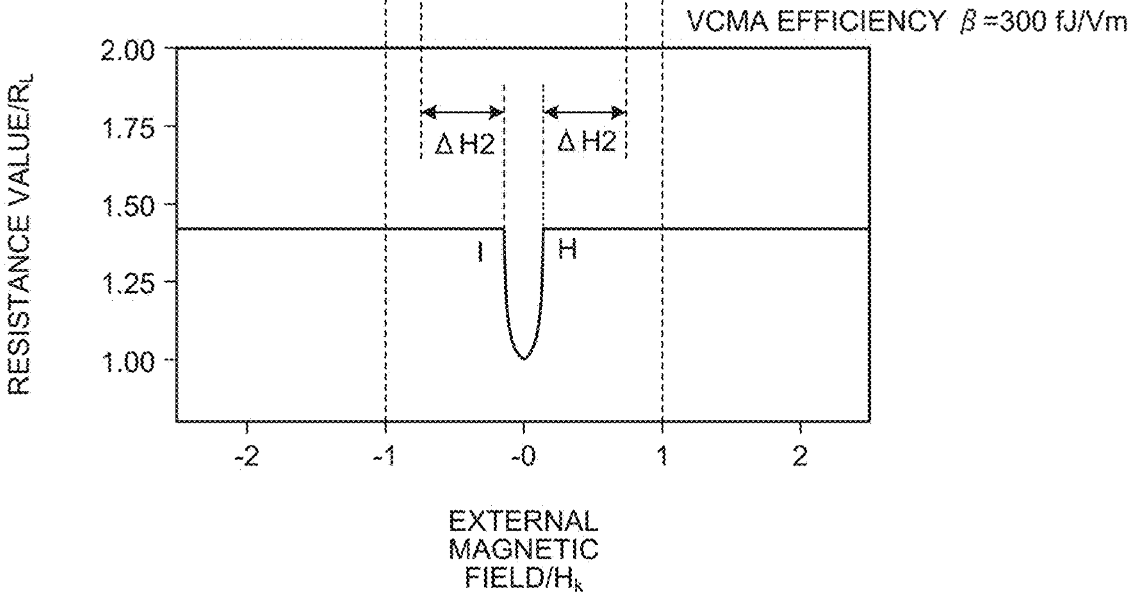

FIGS. 8, 9A, and 9B are graphs illustrating an example of a change in the resistance value when an external magnetic field is applied to the layers. The horizontal axes of the graphs indicate the magnitude of the external magnetic field. Note that the magnitude of the external magnetic field is normalized by an anisotropic magnetic field Hk. The vertical axes of the graphs indicate the resistance value of the magnetoresistive element 100. The resistance value in this example is normalized by the resistance value RL in a low resistance state.

Illustrated in FIG. 8 is a change in the resistance value when the voltage V is not applied to the magnetoresistive element 100 (voltage V=0) and the VCMA is not active. For convenience of description, some external magnetic fields among the external magnetic fields on the graph line are assigned with reference numerals A to E.

It is based on the premise that the external magnetic field is increased from zero in the X-axis positive direction. This change in the external magnetic field is referred to as a positive sweep and is schematically illustrated by an arrow. When the external magnetic field is zero (external magnetic field A), the magnetization M13 of the magnetic layer 13 is oriented in the Z-axis positive direction due to the perpendicular magnetic anisotropy of the magnetic layer 13. The resistance value at this point is equal to the resistance value $R_L$.

When the external magnetic field is increased from the external magnetic field A to an external magnetic field B in the positive sweep, the magnetization M13 of the magnetic layer 13 inclines in the X axis positive direction since having a magnetization component in the external magnetic field direction is more stable in terms of energy. Meanwhile, since the magnetization M11 of the magnetic layer 11 has sufficiently large perpendicular magnetic anisotropy, the magnetization M remains in the Z-axis positive direction even when the external magnetic field increases. The resistance value of the magnetoresistive element 100 gradually increases while the external magnetic field changes from the external magnetic field A to the external magnetic field B.

With the external magnetic field B, the direction of the magnetization M13 of the magnetic layer 13 is aligned with the direction of the external magnetic field. The external magnetic field B is defined as an anisotropic magnetic field $H_k$. Since the angle (relative angle) formed by the magnetization M13 of the magnetic layer 13 and the magnetization M11 of the magnetic layer 11 is 90 degrees, the resistance value of the magnetoresistive element 100 is near the average value of the resistance value $R_L$ in the low resistance state and a resistance value $R_H$ in a high resistance state.

Even when the external magnetic field is further increased from the external magnetic field B in the positive sweep, in this example, increased to an external magnetic field C, the direction of the magnetization M13 of the magnetic layer 13 does not change, and no resistance change occurs.

The same applies to the opposite sweep. It is based on the premise that the external magnetic field is increased from zero in the X-axis negative direction. This change in the external magnetic field is referred to as a negative sweep and is schematically illustrated by an arrow.

When the external magnetic field is increased from the external magnetic field A to an external magnetic field C in a negative sweep, the magnetization M13 of the magnetic layer 13 inclines in the X-axis negative direction. The resistance value of the magnetoresistive element 100 gradually increases while the external magnetic field changes from the external magnetic field A to the external magnetic field D.

With the external magnetic field D, the direction of the magnetization M13 of the magnetic layer 13 is aligned with the direction of the external magnetic field. The resistance value of the magnetoresistive element 100 is near the average value of the resistance value $R_L$ in the low resistance state and the resistance value $R_H$ in the high resistance state.

Even when the external magnetic field is further increased from the external magnetic field D in the negative sweep, in this example, increased to an external magnetic field E, the direction of the magnetization M13 of the magnetic layer 13 does not change, and no resistance change occurs.

The above changes in the resistance value of the magnetoresistive element 100 do not depend on the presence or absence of VCMA since no voltage is applied.

Illustrated in FIGS. 9A and 9B are change in the resistance value when the voltage Vbest is applied to the magnetoresistive element 100 and the external magnetic field in the X-axis direction is applied. Description redundant with that of FIG. 8 is omitted.

In FIG. 9A, illustrated is the change in the resistance value in a case where there is only STT, that is, the VCMA efficiency β=0 (fJ/Vm). In FIG. 9B, illustrated is the change in the resistance value in a case where there are both STT and VCMA, in this example, a case where VCMA efficiency β=300 (fJ/Vm). Here, an external magnetic field that causes the direction of the magnetization M13 of the magnetic layer 13 to substantially coincide with the X-axis direction is referred to as an effective anisotropic magnetic field. For example, a case where the angle between the direction of the magnetization M13 and the X axis is several degrees or less can be included in cases of substantial coincidence. In the drawing, the effective anisotropic magnetic field is exemplified by an effective anisotropic magnetic field F to an effective anisotropic magnetic field I.

The effective anisotropic magnetic field F and the effective anisotropic magnetic field G illustrated in FIG. 9A are smaller than the anisotropic magnetic field Hk by ΔH1. This is because the application of the voltage Vbest causes a current to flow through the magnetoresistive element 100, whereby the temperature of the magnetoresistive element 100 rises due to Joule heat, and as a result, the effective anisotropic magnetic field of the magnetic layer 13 decreases to Hk−ΔH1. The magnitude of ΔH1 depends on the applied voltage, the configuration of the magnetoresistive element 100, the formation process of the magnetoresistive element 100, and others The effective anisotropic magnetic field H and the effective anisotropic magnetic field I illustrated in FIG. 9B are further smaller than the effective anisotropic magnetic field F and the effective anisotropic magnetic field G described above, respectively. The amount of decrease from the anisotropic magnetic field Hk can be separated into ΔH1 and ΔH2. ΔH1 corresponds to the decrease of the anisotropic magnetic field Hk due to Joule heat as described above. ΔH2 is an influence of the VCMA effect itself and is caused by a decrease in the perpendicular magnetic anisotropy of the magnetic layer 13 due to voltage application. The magnitude of ΔH2 depends on the applied voltage, the material of the magnetic layer 13, the VCMA efficiency β, and others.

In both FIGS. 9A and 9B the effective anisotropic magnetic field decreases as compared with the case where the applied voltage is zero (FIG. 8). Since the reduction amount is determined by various factors as described above, it is difficult to determine which is the case where there is only STT and which is the case where there are both STT and VCMA only by comparing FIGS. 9A and 9B. As a result of various studies, it has been found that the two cases be distinguished by performing similar measurement (simulation or the like) at various applied voltages and comparing the voltage dependence of the effective anisotropic magnetic field. This will be described with reference to FIGS. 10A, 10B, 11A, 11B, 11C, and 11D.

FIGS. 10A and 10B include diagrams three-dimensionally illustrating the resistance value of the magnetoresistive element for various combinations of applied voltages and external magnetic fields. An effective anisotropic magnetic field is planarly projected for each voltage V and is plotted. The voltage V here is normalized by the voltage Vbest. In FIG. 10A, illustrated is the resistance value in the case where there is only STT. In FIG. 10B, illustrated is the resistance value in the case where there are both STT and VCMA (in this example, VCMA efficiency β=300 (fJ/Vm)). As can be understood, the behavior of the effective anisotropic magnetic field with respect to the voltage V is different between the case where there is only SST as in FIG. 10A and the case where there are both STT and VCMA as in FIG. 10B.

Figure 11A:
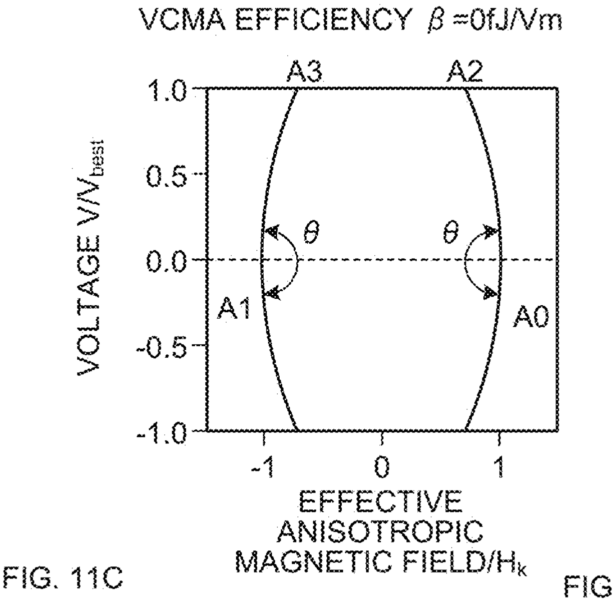
FIGS. 11A, 11B. 11C, and 11D include diagrams illustrating voltage dependence of an effective anisotropic magnetic field.
Figure 11B:
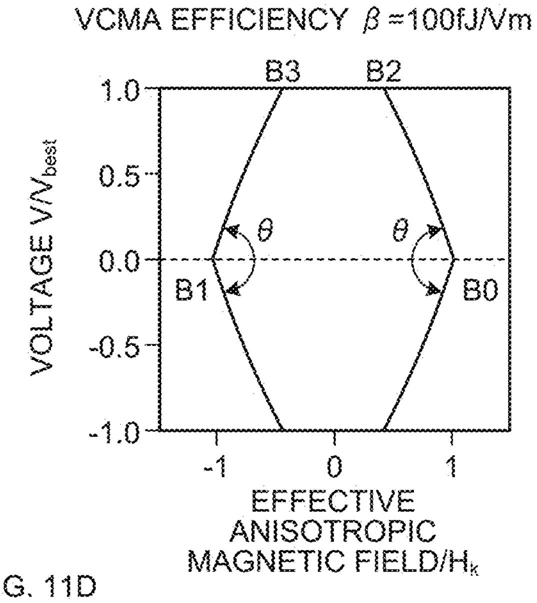

FIGS. 11A. 11B, 11C, and 11D include diagrams illustrating the voltage dependence of the effective anisotropic magnetic field. A phase diagram of the effective anisotropic magnetic field and the voltage V is illustrated. A line (solid line) indicating the voltage dependence of the effective anisotropic magnetic field is referred to as a phase diagram line. In FIG. 11A, illustrated are phase diagram lines in the case where there is only STT. In FIGS. 11B. 11C, and 11D illustrated are phase diagram lines in the case where there are both STT and VCMA. In FIG. 11B, VCMA efficiency β=100 (fJ/Vm), in FIG. 11C, VCMA efficiency β=200 (fJ/Vm), and in FIG. 11D, VCMA efficiency β=300 (fJ/Vm).

In FIG. 11A, intersections of the phase diagram lines and a straight line (broken line) indicating that the voltage V is zero (V/Vbest=0.0) are referred to as point A0 and point A1 and illustrated. At points A0 and A1, the phase diagram lines vary smoothly. At points A0 and A1, the phase diagram lines are orthogonal to the straight line at which the voltage V is zero. The interior angles θ of the phase diagram at point A and point A1 are 180 degrees. In addition, points at which the voltage V equals the voltage Vbest (V/Vbest=1.0) on the phase diagram lines are referred to as point A2 and point A3 and illustrated. A portion between point A0 and point A2 in the phase diagram line is a curve. Similarly, a portion between point A1 and point A3 in the phase diagram line is a curve.

In FIG. 11B, intersections of phase diagram lines and the line at which the voltage V is zero are referred to as points B0 and B1. Points B0 and B1 form vertices of a shape defined by the phase diagram lines. At points B0 and B1, the phase diagram lines are not orthogonal to the straight line at which the voltage V is zero. The interior angles θ of the shape including point B0 and point B1 at vertices is less than 180 degrees. That is, the phase diagram lines define the shape having the vertices at the positions where the voltage V is zero, and the vertices have an interior angle of less than 180 degrees. In addition, points at which the voltage=Vbest on the phase diagram lines are referred to as point B2 and point B3 and illustrated. A portion between point B0 and point B2 in the phase diagram line is substantially straight. For example, in a case where point B0 or point B1 can be recognized as vertices of the shape, point B0 or point B1 can be included in the substantial straight line. Similarly, a portion between point B1 and point B3 in the phase diagram line is substantially straight. That is, the absolute values of the effective anisotropic magnetic field decrease substantially linearly as the voltage V goes away from zero.

Figure 11C:
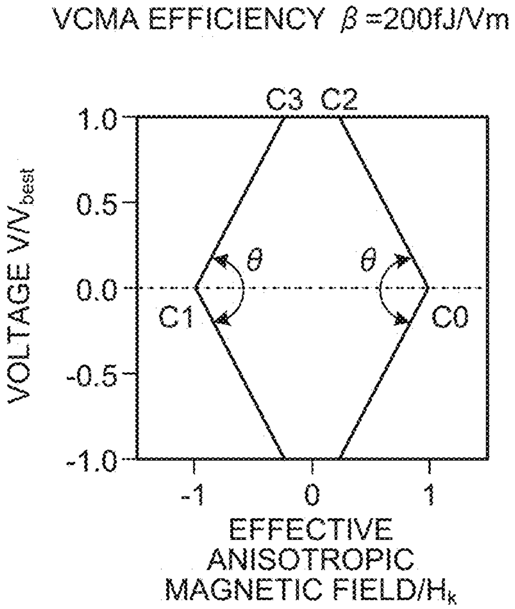
Figure 11D:
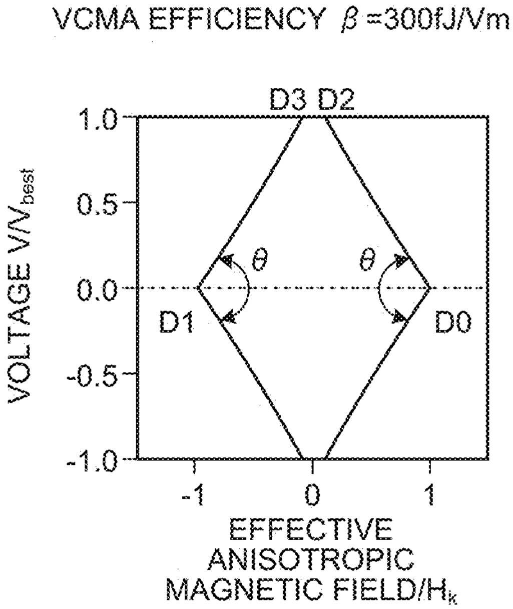

The same applies to FIGS. 11C and 11D. Point C0 to point C3 in FIG. 11C and point D0 to point D3 in FIG. 11D are similar to point B0 to point B3 in FIG. 11B, and thus, description will not be repeated.

As described above, by comparing phase diagrams, the case where there is only STT and the case where there are both STT and VCMA can be easily distinguished. In the present embodiment, the magnetoresistive element 100 has features as illustrated in FIGS. 11B. 11C, and 11D.

Examples of material of each of the components of the magnetoresistive element 100 described above will be described.

For the magnetic layer 11 and the magnetic layer 13, a layer made of a magnetic element such as Fe, Co, Ni, Mn, Nd, Sm, or Tb, an alloy thereof, or the like can be used. Alternatively, it is also possible to use a magnetic layer having a multilayer structure in which the above magnetic elements are stacked or a magnetic layer having a multilayer structure in which the magnetic element and at least one of Pt, Pd, Ir, Ru, Re, Rh, Os, Au, Ag, Cu, Re, W, Mo, Bi, V, Ta, Cr, Ti, Zn, Si, A1, or Mg are stacked. As the magnetic layer 11 and the magnetic layer 13, a crystal layer lattice-matching with the nonmagnetic layer 12, particularly a bcc (001) structure is often used; however, it is also possible to form the layers as an amorphous layer at the time of film formation and to crystallize the layers after a solid-phase epitaxy process by heat treatment.

For the nonmagnetic layer 12, an oxide of at least one element selected from the group consisting of Mg, A1, Ti, Si, Zn, Zr, Hf, Ta, Bi, Cr, Ga, La, Gd, Sr, and Ba or a nitride of at least one element selected from the group consisting of Mg, A1, Ti, Si, Zn, Zr, Hf, Ta, Bi, Cr, Ga, La, Gd, Sr, and Ba is used. In particular, it is more preferable to use MgO, $MgAl_2O_4$, $Al_2O_3$, or the like which has good lattice matching property with a FeCo alloy having a bcc structure, which is a magnetic layer generally used for a magnetoresistive element, and gives a high TMR ratio.

As the base layer and the cap layer, for example, a layer formed of a noble metal such as Cr, Ta, Ru, Au, Ag, Cu, Al, Ti, V, Mo, Zr, Hf, Re, W, Pt, Pd, Ir, or Rh or a transition metal element or a stacked structure thereof can be used. In particular, in a case where a CoFe alloy thin film having a bct structure is used for the magnetic layer 11, it is effective to use Ir, Rh, Pd, Pt, or an alloy containing Ir, Rh, Pd, or Pt as the material of the base layer. The base layer can be used as a lower electrode layer, and the cap layer can be used as an upper electrode layer.

The various layers described above can be produced by, for example, a physical vapor deposition (PVD) method represented by a sputtering method, an ion beam deposition method, and a vacuum deposition method or a chemical vapor deposition (CVD) method represented by an atomic layer deposition (ALD) method. Patterning of these layers can be performed by a reactive ion etching (RIE) method or an ion milling method. The various layers are preferably formed continuously in a vacuum apparatus and then patterned.

2. Second Embodiment

A second embodiment relates to a magnetic device including the magnetoresistive element 100 described above, specifically, a magnetic memory (for example, a semiconductor storage device).

Figure 12:
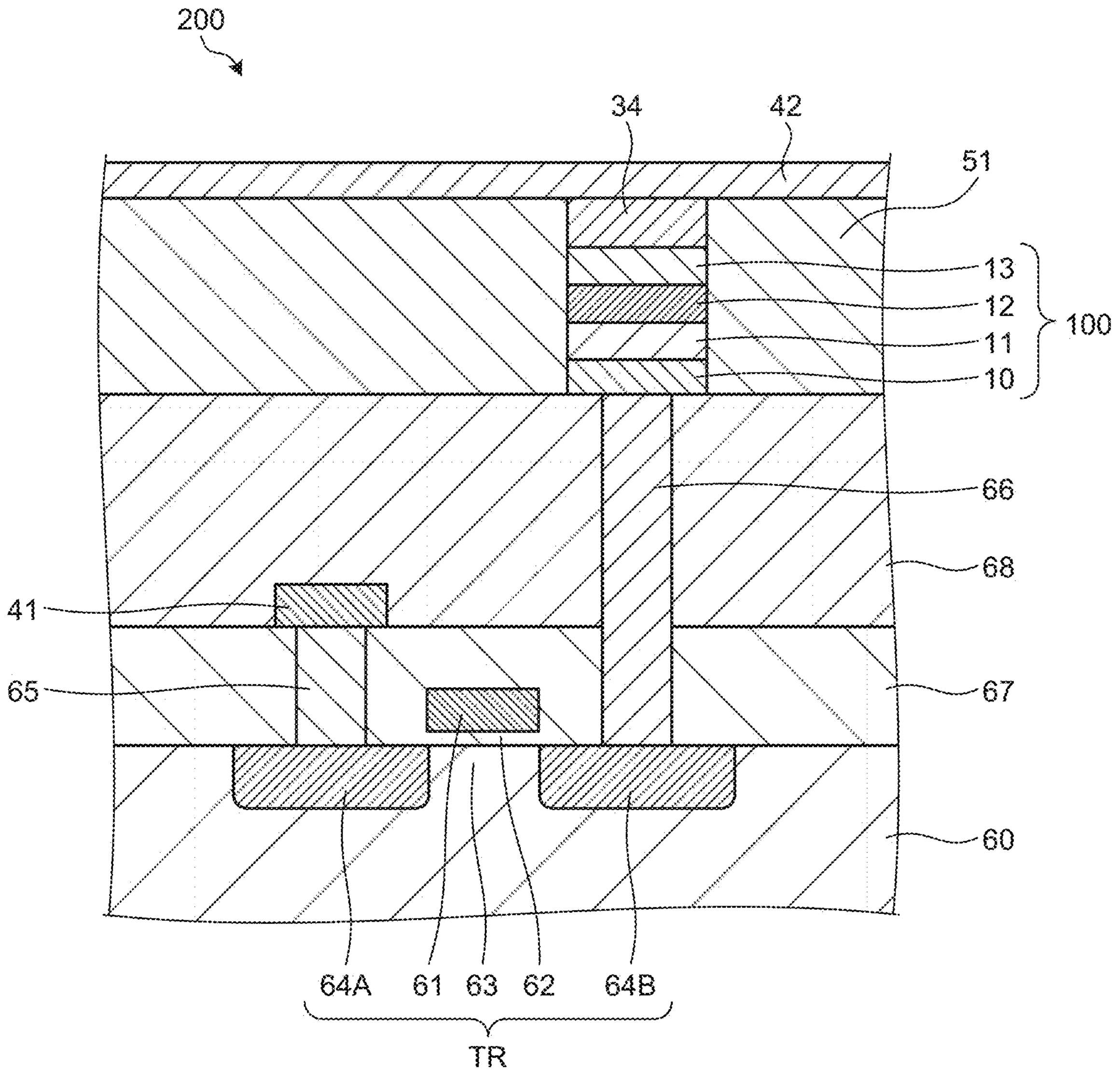
FIG. 12 is a diagram schematically illustrating an example of partial structure of a magnetic memory according to an embodiment.
Figure 13:
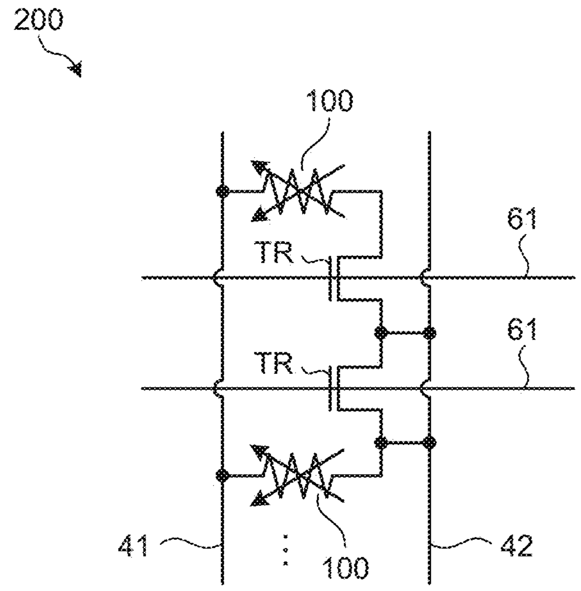
FIG. 13 is a diagram schematically illustrating an example of partial structure of the magnetic memory according to the embodiment.
Figure 14:
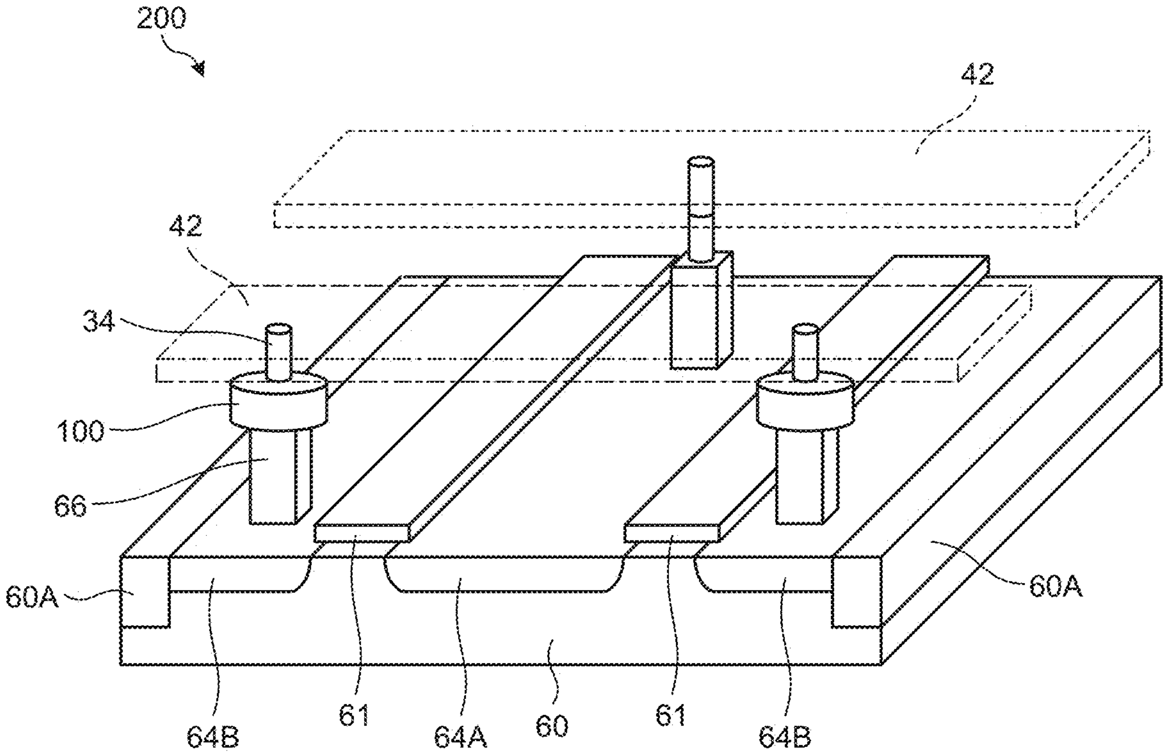
FIG. 14 is a diagram schematically illustrating an example of partial structure of the magnetic memory according to the embodiment.

FIGS. 12 to 14 are diagrams schematically illustrating examples of partial structure of the magnetic memory according to the embodiment. A magnetic memory 200 includes, for example, a plurality of magnetoresistive elements 100 arranged in an array. A portion related to one of the magnetoresistive elements 100 is schematically illustrated. FIG. 12 is a cross-sectional view of the magnetic memory 200. FIG. 13 is an equivalent circuit diagram of the magnetic memory 200. FIG. 14 is a perspective view of the magnetic memory 200.

The base layer and the cap layer of the magnetoresistive element 100 are illustrated as a base layer 10 and a cap layer 34, respectively. In this example, a stacked structure in which the base layer 10, the magnetic layer 11, the nonmagnetic layer 12, the magnetic layer 13, and the cap layer 34 are stacked in this order is included. A selection transistor TR is included below the magnetoresistive element 100. The selection transistor TR illustrated as an example is a field effect transistor.

Specifically, the magnetic memory 200 includes the selection transistor TR formed in a silicon semiconductor substrate 60 and a first interlayer insulating layer 67 covering the selection transistor TR. A first wire (source line) 41 is formed on the first interlayer insulating layer 67. The first wire 41 is electrically connected to a drain/source region 64A which is one of a source region and a drain region of the selection transistor TR via a connection hole (or a connection hole and a landing pad portion or a lower layer wire) 65 included in the first interlayer insulating layer 67.

The second interlayer insulating layer 68 covers the first interlayer insulating layer 67 and the first wire 41. An insulating material layer 51 surrounding the magnetoresistive element 100 and the cap layer 34 is formed on the second interlayer insulating layer 68. The bottom portion of the magnetoresistive element 100 is connected to a drain/source region 64B which is the other of the source region and the drain region of the selection transistor TR via a connection hole 66 included in the first interlayer insulating layer 67 and the second interlayer insulating layer 68.

A second wire (bit line) 42 is formed on the insulating material layer 51. The top portion of the magnetoresistive element 100 is electrically connected to the second wire 42 via the cap layer 34.

The selection transistor TR includes a gate electrode 61, a gate oxide film 62, a channel formation region 63, and the above-described drain/source region 64A and drain/source region 64B. The drain/source region 64A and the first wire 41 are connected via the connection hole 65 as described above.

In addition, the drain/source region 64B is connected to the magnetoresistive element 100 via the connection hole 66. The gate electrode 61 also functions as a so-called word line or an address line. Moreover, a projected image of the second wire 42 in a direction that it extends is orthogonal to a projected image of the gate electrode 61 in a direction that it extends and is parallel to a projected image of the first wire 41 in a direction that it extends. However, in FIG. 12, in order to simplify the drawing, the extending directions of the gate electrode 61, the first wire 41, and the second wire 42 are different from the above.

An overview of a manufacturing method the magnetic memory 200 will be described. First, an element isolation region 60A is formed in the silicon semiconductor substrate 60 on the basis of a known method, and the selection transistor TR including the gate oxide film 62, the gate electrode 61, the drain/source region 64A, and the drain/source region 64B is formed in a portion of the silicon semiconductor substrate 60 surrounded by the element isolation region 60A. A portion of the silicon semiconductor substrate 60 positioned between the drain/source region 64A and the drain/source region 64B corresponds to the channel formation region 63.

Next, the first interlayer insulating layer 67 is formed, the connection hole 65 is formed in a portion of the first interlayer insulating layer 67 above the drain/source region 64A, and furthermore, the first wire 41 is formed on the first interlayer insulating layer 67. Then, the second interlayer insulating layer 68 is formed on the entire surface, and the connection hole 66 is formed in portions of the first interlayer insulating layer 67 and the second interlayer insulating layer 68 above the drain/source region 64B. In this manner, the selection transistor TR covered with the first interlayer insulating layer 67 and the second interlayer insulating layer 68 can be obtained.

Then, the base layer 10, the magnetic layer 11, the nonmagnetic layer 12, the magnetic layer 13, and the cap layer 34 are continuously formed (for example, film formation) on the entire surface, and then the cap layer 34, the magnetic layer 13, the nonmagnetic layer 12, the magnetic layer 11, and the base layer 10 are etched using, for example, an ion beam etching method (IBE method). The base layer 10 is in contact with the connection hole 66.

Next, the insulating material layer 51 is formed on the entire surface, and planarization processing is performed on the insulating material layer 51, thereby making the top surface of the insulating material layer 51 at the same level as the top surface of the cap layer 34. The, the second wire 42 being in contact with the cap layer 34 is formed on the insulating material layer 51. In this manner, the magnetic memory 200 having the structure as illustrated in FIG. 12 can be obtained. A general MOS manufacturing process can be applied to the manufacture of the magnetic memory 200, and the magnetic memory 200 can be applied as a general-purpose memory.

Figure 15:
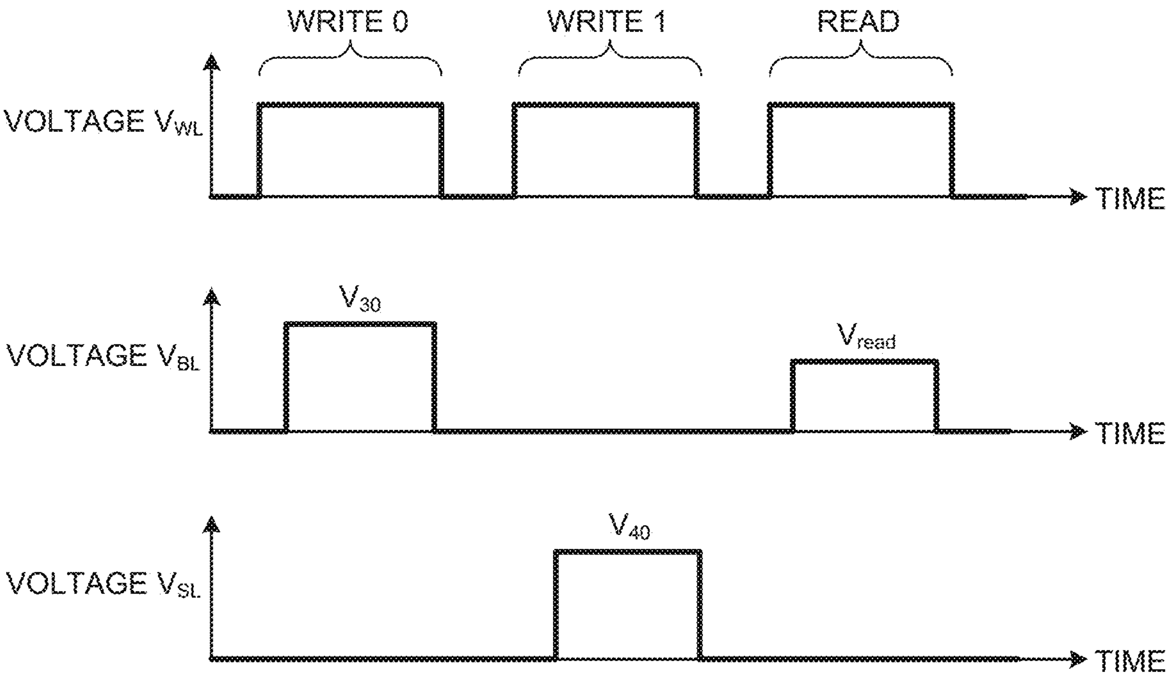
FIG. 15 is a diagram illustrating an example of timing charts of writing and reading of the magnetic memory.

FIG. 15 is a diagram illustrating an example of timing charts of writing and reading of the magnetic memory. Writing and reading are performed, for example, by applying a voltage to a source line (corresponding to the first wire 41), a bit line (corresponding to the second wire 42), and a word line (corresponding to the gate electrode 61) from a writing circuit and a reading circuit (not illustrated). The voltages applied to the source line, the bit line, and the word line are referred to as a voltage $V_{SL}$, a voltage $V_{BL}$, and a voltage $V_{WL}$, respectively.

When information "0" is written, the voltage $V_{BL}$ is set to a voltage value equal to $V_{30}$. The voltage $V_{30}$ is a voltage adjusted such that the voltage $V_3$ is applied to the magnetoresistive element 100. When information "1" is written, the voltage $V_{SL}$ is set to a voltage value equal to $V_{40}$. The voltage $V_{40}$ is a voltage adjusted such that $V_4$ is applied to the magnetoresistive element 100. When reading is performed, the voltage $V_{BL}$ is set to a voltage value equal to a voltage Vread. The voltage Vread is set to a voltage value at which no writing is performed on the magnetoresistive element 100. In addition, the voltage Vread may be applied to the source line (first wire 41) instead of applying the voltage Vread to the bit line (second wire 42). In each operation, the voltage $V_{WL}$ may have different voltage values.

Although the present invention has been described on the basis of preferred embodiments, the present invention is not limited to these embodiments and can be implemented in various other forms, and various omissions, substitutions, and modifications can be made without departing from the gist of the invention. In addition, various stacking structures, materials used, and others described in the embodiments are examples and can be modified as appropriate.

3. Exemplary Effects

The technology described above is specified as follows, for example. One piece of the disclosed technology is a magnetoresistive element 100. As described with reference to FIGS. 1, 2A, 2B, 3, and 4 and others, the magnetoresistive element 100 includes the magnetic layer 11, the magnetic layer 13, and the nonmagnetic layer 12. The magnetic layer 11 is the first magnetic layer. The magnetic layer 13 is the second magnetic layer that changes between the perpendicular magnetization layer in which the perpendicular magnetic anisotropy energy Ku determined on the basis of a difference between the magnetic energy E|| when magnetized in the plane direction (X-axis direction) of the layer and the magnetic energy $E_{\perp}$ when magnetized in the direction (Z-axis direction) perpendicular to the plane direction of the layer is positive and the in-plane magnetization layer in which the perpendicular magnetic anisotropy energy Ku is negative. The nonmagnetic layer 12 is included between the magnetic layer 11 and the nonmagnetic layer 12. The magnetic layer 13 is the perpendicular magnetization layer when no voltage V is applied to the magnetoresistive element 100, changes from the perpendicular magnetization layer to the in-plane magnetization layer when the voltage V1 is applied to the magnetoresistive element 100, and changes from the perpendicular magnetization layer to the in-plane magnetization layer when the voltage V2 is applied to the magnetoresistive element 100. The magnetization M13 of the magnetic layer 13 changes to the first direction (Z-axis positive direction) of the direction perpendicular to the plane of the layer (Z-axis direction) after the voltage V3 is applied to the magnetoresistive element 100 for the first period of time, and changes in the second direction (Z-axis negative direction) of the direction perpendicular to the plane of the layer (Z-axis direction) after the voltage V4 is applied to the magnetoresistive element 100 for the second period of time. The voltage V1 and the voltage V2 are the first voltage and the second voltage in opposite directions to each other. The voltage V3 and the voltage V4 are the third voltage and the fourth voltage, respectively, in opposite directions to each other.

According to the magnetoresistive element 100, the magnetic layer 13 can be changed from the perpendicular magnetization layer to the in-plane magnetization layer by applying the voltage $V_1$ or the voltage $V_2$ in opposite directions to each other (corresponding to VCMA). Furthermore, the magnetization M13 of the magnetic layer 13 can be changed by applying the voltage $V_3$ or the voltage $V_4$ in opposite directions to each other (corresponding to STT). By using both VCMA and STT in this manner, bidirectional writing can be performed with a bipolar voltage. The shape of the magnetoresistive element 100 as viewed in the Z-axis direction may not be a shape without mirror symmetry nor rotational symmetry as in Patent Literature 1. Therefore, it is possible to provide the magnetoresistive element 100 that enables bipolar voltage writing and is easy to manufacture.

As described with reference to FIGS. 3 and 4 and others, the perpendicular magnetic anisotropy energy Ku of the magnetic layer 13 may linearly decrease as the voltage V applied to the magnetoresistive element 100 approaches the voltage $V_1$ from zero, change from positive to negative at the voltage $V_1$, linearly decrease as the voltage V applied to the magnetoresistive element 100 approaches the voltage $V_2$ from zero, and change from positive to negative at the voltage $V_2$. For example, bipolar voltage writing can be performed using the magnetoresistive element 100 having such a characteristic that the perpendicular magnetic anisotropy energy Ku changes in an approximately Λ (lambda) shape with respect to the voltage V.

As described with reference to FIG. 4 and others, the voltage $V_1$ and the voltage $V_3$ may be voltages in the same direction, and the voltage $V_2$ and the voltage $V_4$ may be voltages in the same direction. In that case, as described with reference to FIG. 5 and others, the absolute value of the voltage $V_3$ may be less than or equal to twice the absolute value of the voltage $V_1$, and the absolute value of the voltage $V_4$ may be less than or equal to twice the absolute value of the voltage $V_2$. By applying such a voltage $V_3$ or voltage $V_4$ (for example, the voltage $V_{best}$), the magnetization M13 of the magnetic layer 13 can be changed with small power consumption.

The first period of time during which the voltage $V_3$ is applied may be less than or equal to 100 ns, and the second period of time during which the voltage $V_4$ is applied may be less than or equal to 100 ns. The magnetization M13 of the magnetic layer 13 can be changed with such reversal time that the power consumption is not too large.

As described with reference to FIG. 1 and the like, the magnetoresistive element 100 may have at least one of a mirror-symmetrical shape and a rotation-symmetrical shape when viewed in the stacking direction (Z-axis direction). For example, the magnetoresistive element 100 may have at least one of a round shape, an elliptical shape, a square shape, or a rectangular shape when viewed in the stacking direction (Z-axis direction). With the magnetoresistive element 100 having such a symmetrical shape, the magnetoresistive element 100 can be easily manufactured, for example.

As described with reference to FIGS. 9A, 9B, 10A, 10B, 11A, 11B, 11C and 11D and others, defining an external magnetic field that causes the direction of the magnetization M13 of the magnetic layer 13 to substantially coincide with the plane direction (X-axis direction) of the layer as an effective anisotropic magnetic field (such as the effective anisotropic magnetic field G to the effective anisotropic magnetic field I in FIGS. 9A and 9B), the absolute value of the effective anisotropic magnetic field may substantially linearly decrease as the voltage V applied to the magnetoresistive element 100 goes away from zero. For example, a phase diagram line illustrating a relationship between the effective anisotropic magnetic field and the applied voltage V may define a shape having vertices at positions where the applied voltage V is zero, and the vertices may have an interior angle of less than 180 degrees. For example, from such voltage dependence of the effective anisotropic magnetic field, it is possible to specify that in the magnetoresistive element 100 information is written using both STT and VCMA.

The magnetic memory 200 described with reference to FIGS. 12 to 14 and others is also one piece of the disclosed technology. The magnetic memory 200 includes a plurality of the magnetoresistive elements 100. As a result, it is possible to provide the magnetic memory 200 that enables bipolar voltage writing and is easy to manufacture.

Note that the effects described herein are merely examples, and it is not limited to the disclosed content. There may be other effects.

Although the embodiments of the disclosure have been described above, the technical scope of the disclosure is not limited to the above embodiments as they are, and various modifications can be made without departing from the gist of the disclosure. In addition, components of different embodiments and modifications may be combined as appropriate.

Note that the present technology can also have the following structures.

(1) A magnetoresistive element comprising:
a first magnetic layer;
a second magnetic layer that changes between a perpendicular magnetization layer in which perpendicular magnetic anisotropy energy is positive, and an in-plane magnetization layer in which the perpendicular magnetic anisotropy energy is negative, the perpendicular magnetic anisotropy energy determined on a basis of a difference between magnetic energy when magnetized in a plane direction of the layer and magnetic energy when magnetized in a direction perpendicular to the plane direction of the layer; and
a nonmagnetic layer disposed between the first magnetic layer and the second magnetic layer, wherein
the second magnetic layer:
is the perpendicular magnetization layer when no voltage is applied to the magnetoresistive element;
changes from the perpendicular magnetization layer to the in-plane magnetization layer when a first voltage is applied to the magnetoresistive element; and
changes from the perpendicular magnetization layer to the in-plane magnetization layer when a second voltage is applied to the magnetoresistive element,
magnetization of the second magnetic layer:
changes to a first direction of a direction perpendicular to a plane of the layer after a third voltage is applied to the magnetoresistive element for a first period of time; and
changes to a second direction of the direction perpendicular to the plane of the layer after a fourth voltage is applied to the magnetoresistive element for a second period of time,
the first voltage and the second voltage are in opposite directions to each other, and
the third voltage and the fourth voltage are in opposite directions to each other.

(2) The magnetoresistive element according to (1), wherein
the perpendicular magnetic anisotropy energy of the second magnetic layer:
linearly decreases as a voltage applied to the magnetoresistive element approaches the first voltage from zero and changes from positive to negative at the first voltage; and
linearly decreases as the voltage applied to the magnetoresistive element approaches the second voltage from zero and changes from positive to negative at the second voltage.

(3) The magnetoresistive element according to (1) or (2), wherein
the first voltage and the third voltage are voltages in a same direction, and
the second voltage and the fourth voltage are in a same direction.

(4) The magnetoresistive element according to (3), wherein
an absolute value of the third voltage is less than or equal to twice an absolute value of the first voltage, and
an absolute value of the fourth voltage is less than or equal to twice an absolute value of the second voltage.

(5) The magnetoresistive element according to any one of (1) to (4), wherein
the first period of time is less than or equal to 100 ns, and
the second period of time is less than or equal to 100 ns.

(6) The magnetoresistive element according to any one of (1) to (5), wherein
the magnetoresistive element has at least one of a mirror-symmetrical shape or a rotation-symmetrical shape when viewed in a stacking direction.

(7) The magnetoresistive element according to any one of (1) to (6), wherein
the magnetoresistive element has at least one of a round shape, an elliptical shape, a square shape, or a rectangular shape when viewed in a stacking direction.

(8) The magnetoresistive element according to any one of (1) to (7), wherein,
defining an external magnetic field that causes a direction of the magnetization of the second magnetic layer to substantially coincide with the plane direction of the layer as an effective anisotropic magnetic field,
an absolute value of the effective anisotropic magnetic field decreases substantially linearly as the voltage applied to the magnetoresistive element goes away from zero.

(9) The magnetoresistive element according to (8), wherein,
defining an external magnetic field that causes a direction of the magnetization of the second magnetic layer to substantially coincide with the plane direction of the layer as an effective anisotropic magnetic field,
a phase diagram line indicating a relationship between the effective anisotropic magnetic field and the voltage that is applied defines a shape having a vertex at a position at which the voltage that is applied is zero, and
the vertex has an interior angle of less than 180 degrees.

(10) A magnetic memory comprising:
a plurality of magnetoresistive elements, wherein
each of the plurality of magnetoresistive elements includes:
a first magnetic layer;
a second magnetic layer that changes between a perpendicular magnetization layer in which perpendicular magnetic anisotropy energy is positive, and an in-plane magnetization layer in which the perpendicular magnetic anisotropy energy is negative, the perpendicular magnetic anisotropy energy obtained by subtracting magnetic energy when magnetized in a stacking direction from magnetic energy when magnetized in a plane direction of the layer; and a nonmagnetic layer disposed between the first magnetic layer and the second magnetic layer, the second magnetic layer:

is the perpendicular magnetization layer when no voltage is applied to the magnetoresistive element;

changes from the perpendicular magnetization layer to the in-plane magnetization layer when a first voltage is applied to the magnetoresistive element; and changes from the perpendicular magnetization layer to the in-plane magnetization layer when a second voltage is applied to the magnetoresistive element, magnetization of the second magnetic layer:

changes to a first direction on a plane of the layer while a third voltage is applied to the magnetoresistive element; and changes to a second direction on the plane of the layer while a fourth voltage is applied to the magnetoresistive element, the first voltage and the second voltage are in opposite directions to each other, and the third voltage and the fourth voltage are in opposite directions to each other.

REFERENCE SIGNS LIST

10 BASE LAYER
11 MAGNETIC LAYER (FIRST MAGNETIC LAYER AND PINNED LAYER)
12 NONMAGNETIC LAYER
13 MAGNETIC LAYER (SECOND MAGNETIC LAYER AND RECORDING LAYER)
34 CAP LAYER
41 FIRST WIRE
42 SECOND WIRE
51 INSULATING MATERIAL LAYER
60 SILICON SEMICONDUCTOR SUBSTRATE
61 GATE ELECTRODE
62 GATE OXIDE FILM
63 CHANNEL FORMATION REGION
64A DRAIN/SOURCE REGION
64B DRAIN/SOURCE REGION
65 CONNECTION HOLE
66 CONNECTION HOLE
67 FIRST INTERLAYER INSULATING LAYER
68 SECOND INTERLAYER INSULATING LAYER
100 MAGNETORESISTIVE ELEMENT
200 MAGNETIC MEMORY
M11 MAGNETIZATION
M13 MAGNETIZATION
TR SELECTION TRANSISTOR

The invention claimed is:

1. A magnetoresistive element, comprising:

a first magnetic layer;

a second magnetic layer configured to change between a perpendicular magnetization layer in which perpendicular magnetic anisotropy energy is positive, and an in-plane magnetization layer in which the perpendicular magnetic anisotropy energy is negative, wherein the perpendicular magnetic anisotropy energy is based on a difference between first magnetic energy when magnetized in a plane direction of the second magnetic layer and second magnetic energy when magnetized in a direction perpendicular to the plane direction of the second magnetic layer; and a nonmagnetic layer between the first magnetic layer and the second magnetic layer, wherein the second magnetic layer:

is the perpendicular magnetization layer when no voltage is applied to the magnetoresistive element;

changes from the perpendicular magnetization layer to the in-plane magnetization layer when a first voltage is applied to the magnetoresistive element; and changes from the perpendicular magnetization layer to the in-plane magnetization layer when a second voltage is applied to the magnetoresistive element, magnetization of the second magnetic layer:

changes to a first direction of the direction perpendicular to the plane direction of the second magnetic layer after a third voltage is applied to the magnetoresistive element for a first period of time; and changes to a second direction of the direction perpendicular to the plane direction of the second magnetic layer after a fourth voltage is applied to the magnetoresistive element for a second period of time, the first voltage and the second voltage are in opposite directions, the third voltage and the fourth voltage are in opposite directions, the first voltage and the third voltage are in a same direction, the second voltage and the fourth voltage are in a same direction, an absolute value of the third voltage is less than or equal to twice an absolute value of the first voltage, and an absolute value of the fourth voltage is less than or equal to twice an absolute value of the second voltage.

2. The magnetoresistive element according to claim 1, wherein the perpendicular magnetic anisotropy energy of the second magnetic layer:

linearly decreases as a voltage applied to the magnetoresistive element approaches the first voltage from zero, and changes from positive to negative at the first voltage; and linearly decreases as the voltage applied to the magnetoresistive element approaches the second voltage from zero, and changes from positive to negative at the second voltage.

3. The magnetoresistive element according to claim 1, wherein the first period of time is less than or equal to 100 ns, and the second period of time is less than or equal to 100 ns.

4. The magnetoresistive element according to claim 1, wherein the magnetoresistive element has at least one of a mirror-symmetrical shape or a rotation-symmetrical shape when viewed in a stacking direction.

5. The magnetoresistive element according to claim 1, wherein the magnetoresistive element has at least one of a round shape, an elliptical shape, a square shape, or a rectangular shape when viewed in a stacking direction.

6. The magnetoresistive element according to claim 1, wherein, defining an external magnetic field that causes a direction of the magnetization of the second magnetic layer to substantially coincide with the plane direction of the second magnetic layer as an effective anisotropic magnetic field, an absolute value of the effective anisotropic magnetic field decreases substantially linearly as a voltage applied to the magnetoresistive element goes away from zero.

7. The magnetoresistive element according to claim 1, wherein, defining an external magnetic field that causes a direction of the magnetization of the second magnetic layer to substantially coincide with the plane direction of the second magnetic layer as an effective anisotropic magnetic field, a phase diagram line indicating a relationship between the effective anisotropic magnetic field and a voltage applied to the magnetoresistive element defines a shape having:

a vertex at a position at which the voltage applied to the magnetoresistive element is zero, and the vertex has an interior angle of less than 180 degrees.

8. A magnetic memory, comprising:

a plurality of magnetoresistive elements, wherein a magnetoresistive element of the plurality of magnetoresistive elements includes:

a first magnetic layer;

a second magnetic layer configured to change between a perpendicular magnetization layer in which perpendicular magnetic anisotropy energy is positive, and an in-plane magnetization layer in which the perpendicular magnetic anisotropy energy is negative, wherein the perpendicular magnetic anisotropy energy is obtained by subtraction of first magnetic energy when magnetized in a stacking direction of the second magnetic layer from second magnetic energy when magnetized in a plane direction of the second magnetic layer, and a nonmagnetic layer between the first magnetic layer and the second magnetic layer, wherein the second magnetic layer:

is the perpendicular magnetization layer when no voltage is applied to the magnetoresistive element;

changes from the perpendicular magnetization layer to the in-plane magnetization layer when a first voltage is applied to the magnetoresistive element; and changes from the perpendicular magnetization layer to the in-plane magnetization layer when a second voltage is applied to the magnetoresistive element, magnetization of the second magnetic layer:

changes to a first direction on a plane of the second magnetic layer while a third voltage is applied to the magnetoresistive element; and changes to a second direction on the plane of the second magnetic layer while a fourth voltage is applied to the magnetoresistive element, the first voltage and the second voltage are in opposite directions, the third voltage and the fourth voltage are in opposite directions, the first voltage and the third voltage are in a same direction, the second voltage and the fourth voltage are in a same direction, an absolute value of the third voltage is less than or equal to twice an absolute value of the first voltage, and an absolute value of the fourth voltage is less than or equal to twice an absolute value of the second voltage.

* * * * *